United States Patent [19]

Ogura et al.

[11] Patent Number: 5,315,134
[45] Date of Patent: May 24, 1994

[54] THYRISTOR WITH INSULATED GATE

[75] Inventors: Tsuneo Ogura, Yokohama; Kiminori Watanabe, Kawasaki; Akio Nakagawa, Hiratsuka; Yoshihiro Yamaguchi, Urawa; Norio Yasuhara, Yokohama; Tomoko Matsudai, Tokyo, all of Japan

[73] Assignee: Kabushiki Kaisha Toshiba, Kawasaki, Japan

[21] Appl. No.: 896,422

[22] Filed: Jun. 10, 1992

[30] Foreign Application Priority Data

Jun. 10, 1991 [JP] Japan .................................. 3-137894
Dec. 26, 1991 [JP] Japan .................................. 3-345501

[51] Int. Cl.⁵ .................... H01L 29/74; H01L 31/111
[52] U.S. Cl. .................... 257/138; 257/139; 257/137
[58] Field of Search ............... 257/139, 143, 141, 142, 257/124, 125, 128, 378, 133, 163, 768, 38, 138

[56] References Cited

U.S. PATENT DOCUMENTS

| | | | |
|---|---|---|---|
| Re. 32,784 | 11/1988 | Nakagawa et al. | 357/23.4 |
| 4,672,407 | 6/1987 | Nakagawa et al. | 357/23.4 |
| 4,680,604 | 7/1987 | Nakagawa et al. | 357/23.4 |
| 4,760,431 | 6/1988 | Nakagawa et al. | 357/23.4 |
| 4,782,372 | 11/1988 | Nakagawa et al. | 357/23.4 |
| 4,857,983 | 8/1989 | Baliga et al. | 357/23.8 |
| 4,860,072 | 8/1989 | Zommer | 357/23.8 |
| 4,866,315 | 2/1988 | Ogura et al. | 307/637 |
| 4,881,120 | 11/1989 | Nakagawa et al. | 357/23.4 |
| 4,912,541 | 3/1990 | Baliga et al. | 317/38 |
| 4,914,496 | 4/1990 | Nakagawa et al. | 357/23.4 |
| 4,928,155 | 5/1990 | Nakagawa et al. | 357/23.4 |
| 4,959,703 | 9/1990 | Ogura et al. | 307/38 |
| 4,963,951 | 10/1990 | Adler et al. | 357/23.8 |
| 4,963,972 | 10/1990 | Shinohe et al. | 357/38 |
| 4,994,696 | 2/1991 | Ogura et al. | 307/63.3 |
| 5,086,323 | 2/1992 | Nakagawa et al. | 357/23.4 |
| 5,093,701 | 3/1992 | Nakagawa et al. | 357/23.4 |

FOREIGN PATENT DOCUMENTS 0329993 8/1989 European Pat. Off. .
0331892 9/1989 European Pat. Off. .
90/10311 9/1990 PCT Int'l Appl. .

OTHER PUBLICATIONS

MOS Controlled Thyristors V.A.K. Temple, 1984.
MOS GTO Stoisiek et al, 1985.

Primary Examiner—William L. Sikes
Assistant Examiner—Fetsum Abraham
Attorney, Agent, or Firm—Oblon, Spivak, McClelland, Maier & Neustadt

[57] ABSTRACT

A thyristor with an insulated gate includes a p-type emitter layer, an n-type base layer, a p-type base layer, and an n-type emitter layer. A drain electrode contacting the p-type base layer is formed adjacent to one side of the n-type emitter layer. An n-type drain layer, which is short-circuited with the p-type base layer by the drain electrode, is formed. An n-type source layer is formed a predetermined distance away from the n-type drain layer. A turn-off insulated gate is formed between the n-type source layer and the n-type drain layer. A source electrode is connected to a cathode electrode. Thereby, turn-off capability of the thyristor can be improved.

16 Claims, 35 Drawing Sheets

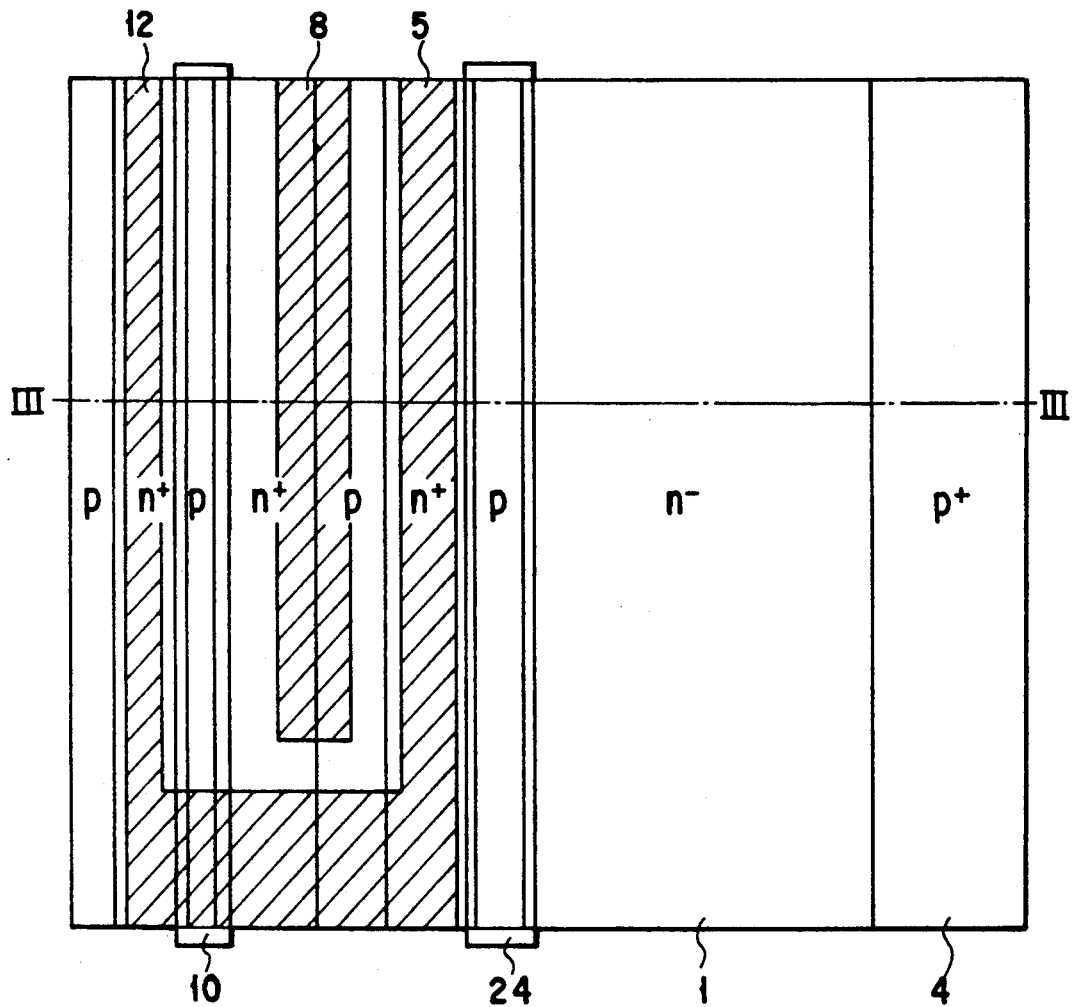
F I G. 2

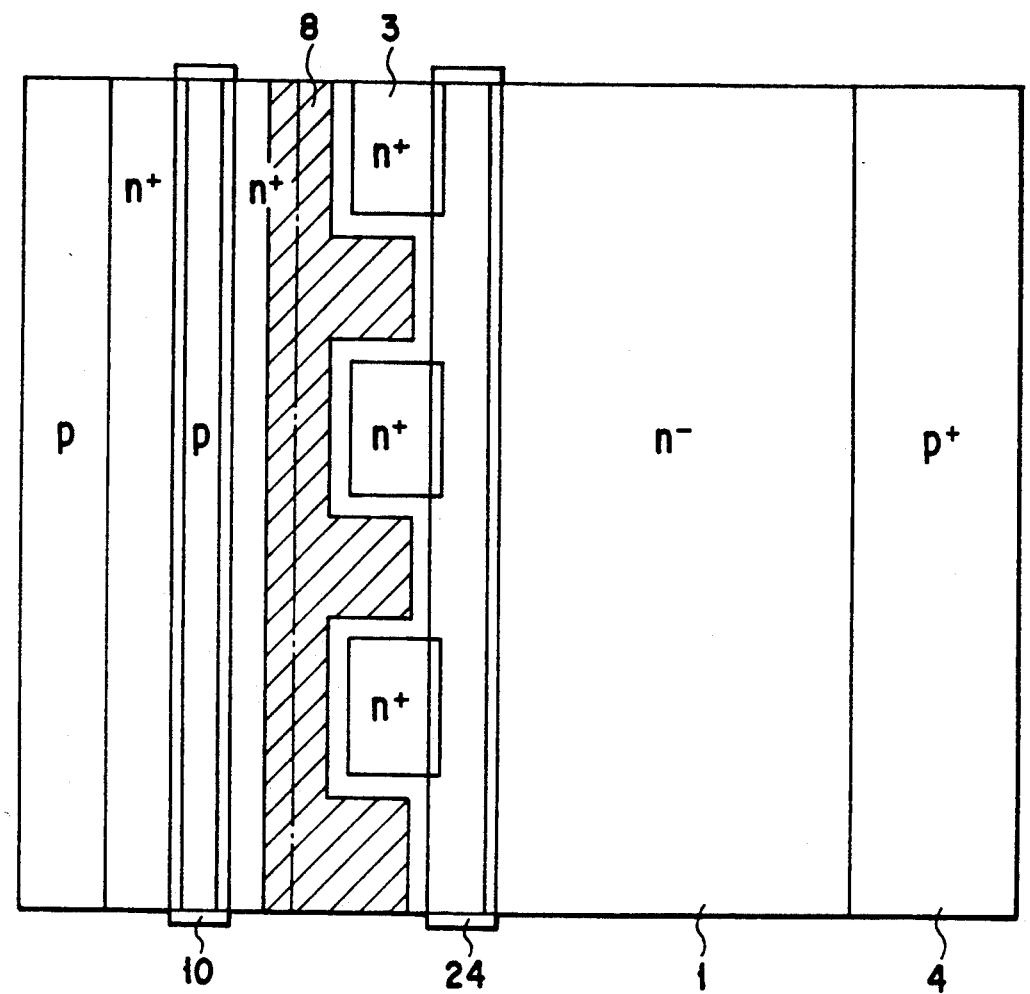
F I G. 4

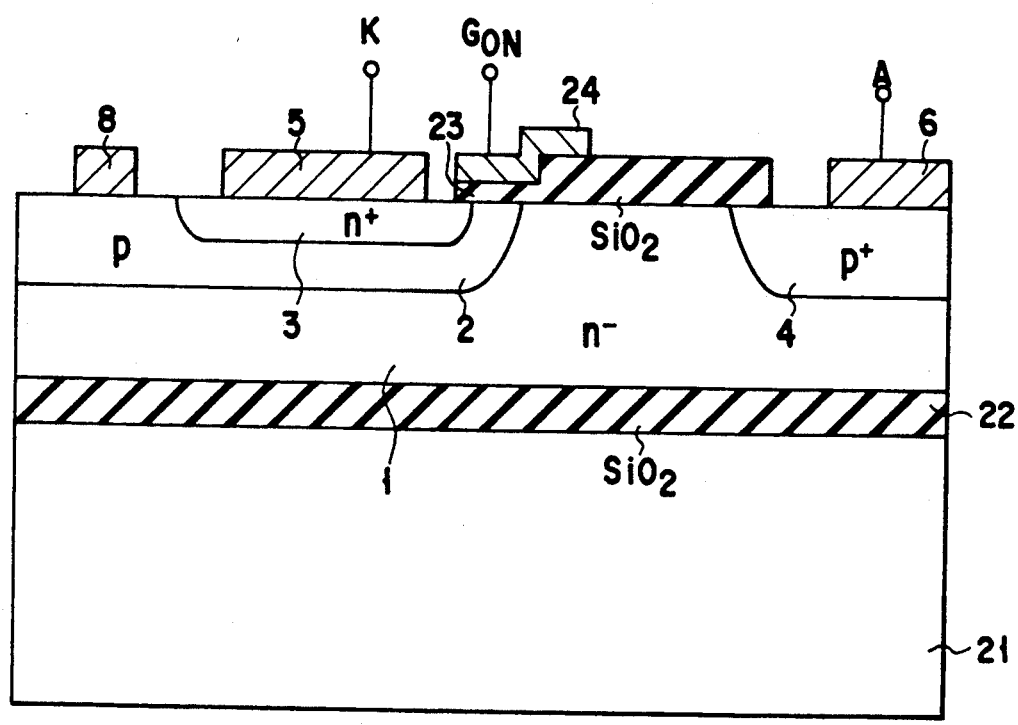
F I G. 7

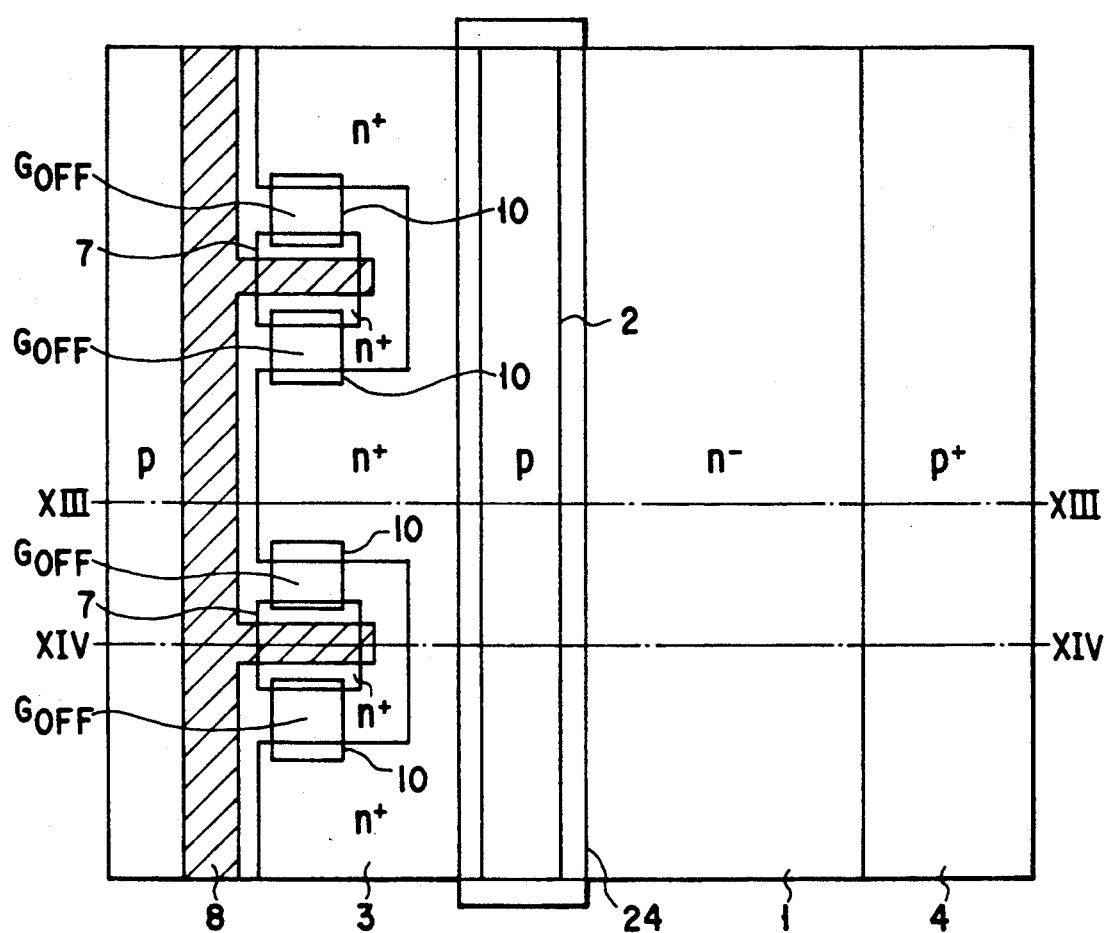
F I G. 12

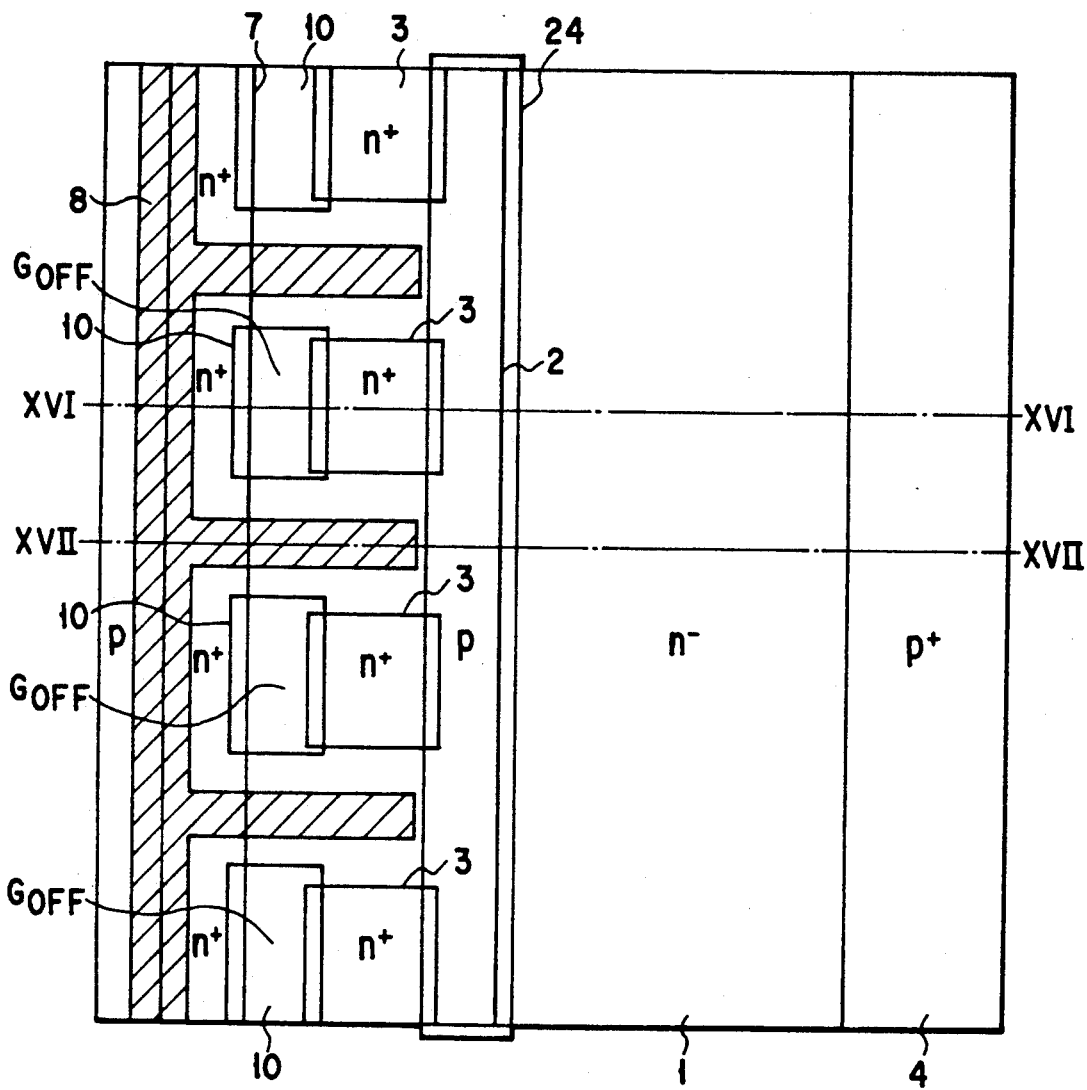
F I G. 15

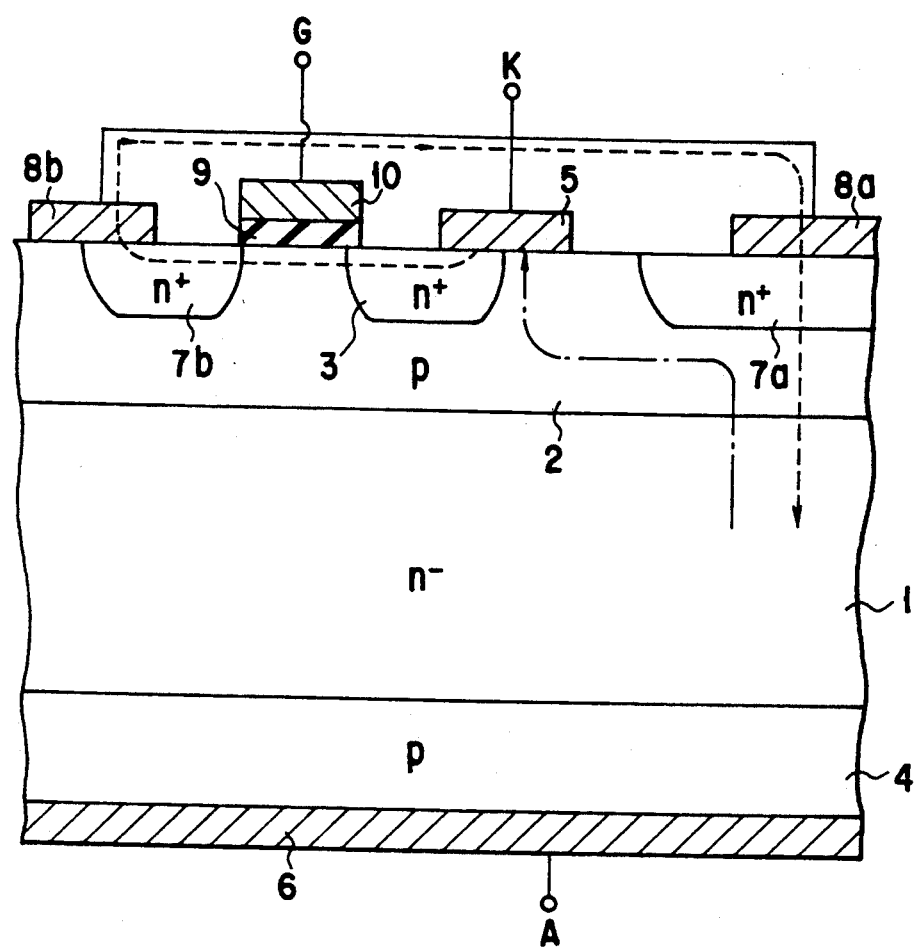
F I G. 21

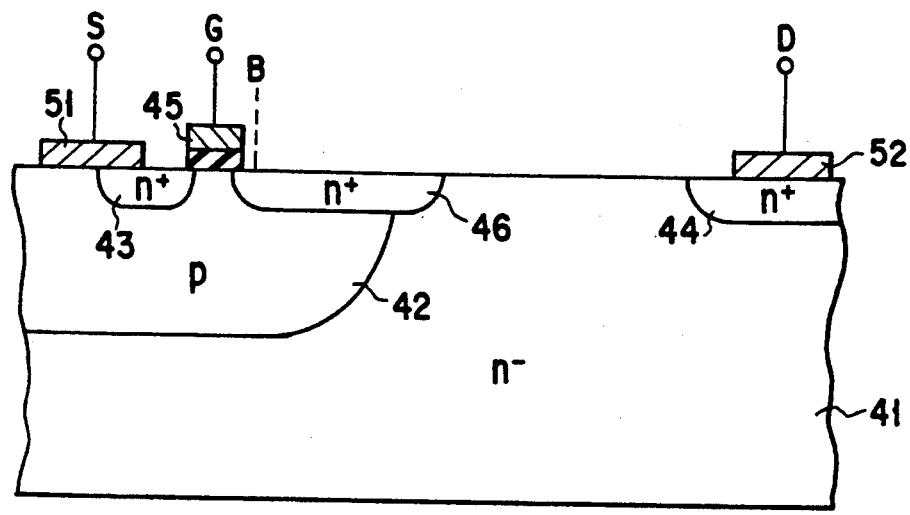
F I G. 26
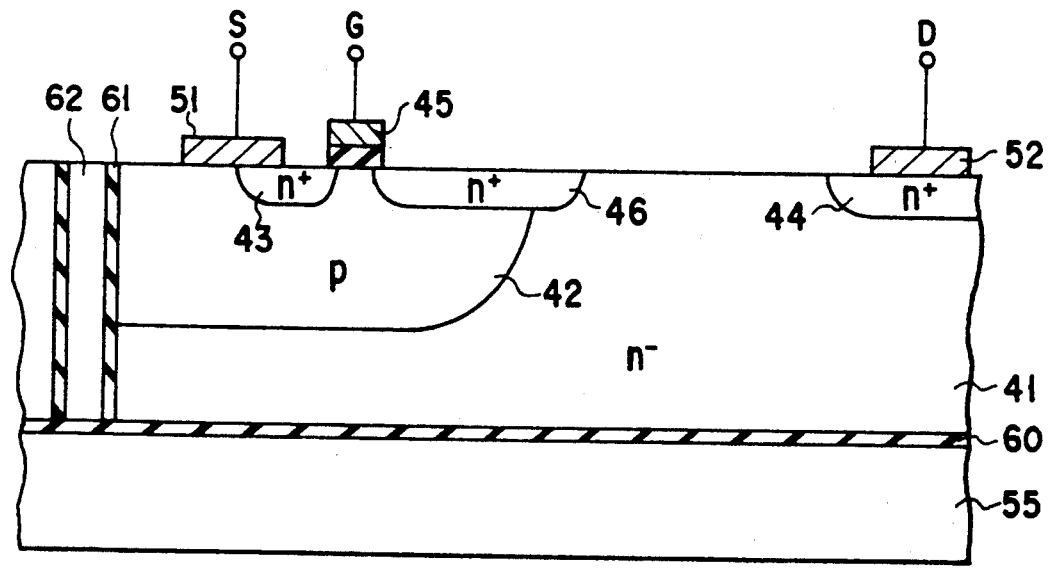
F I G. 28

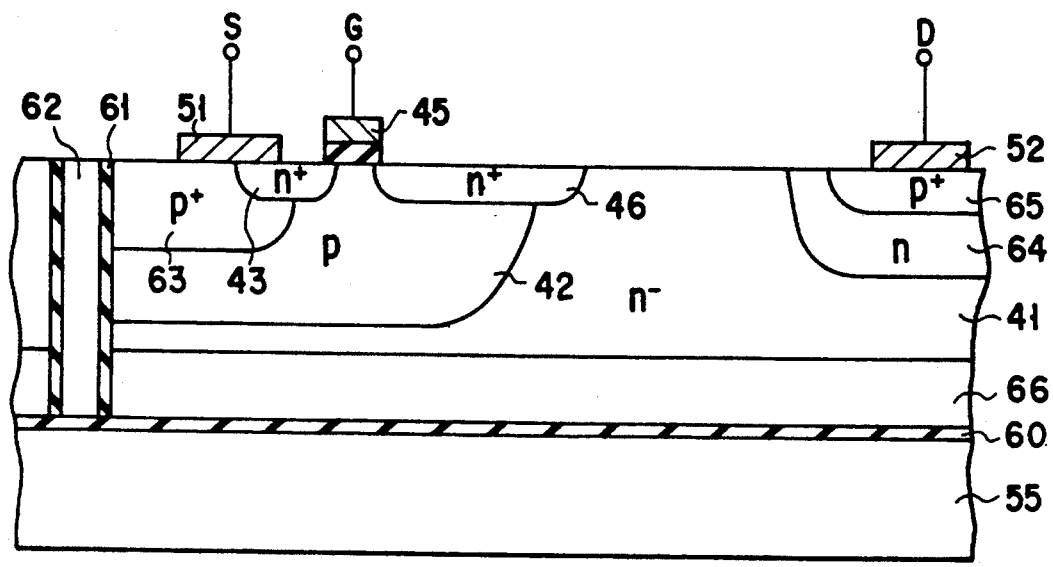
F I G. 31
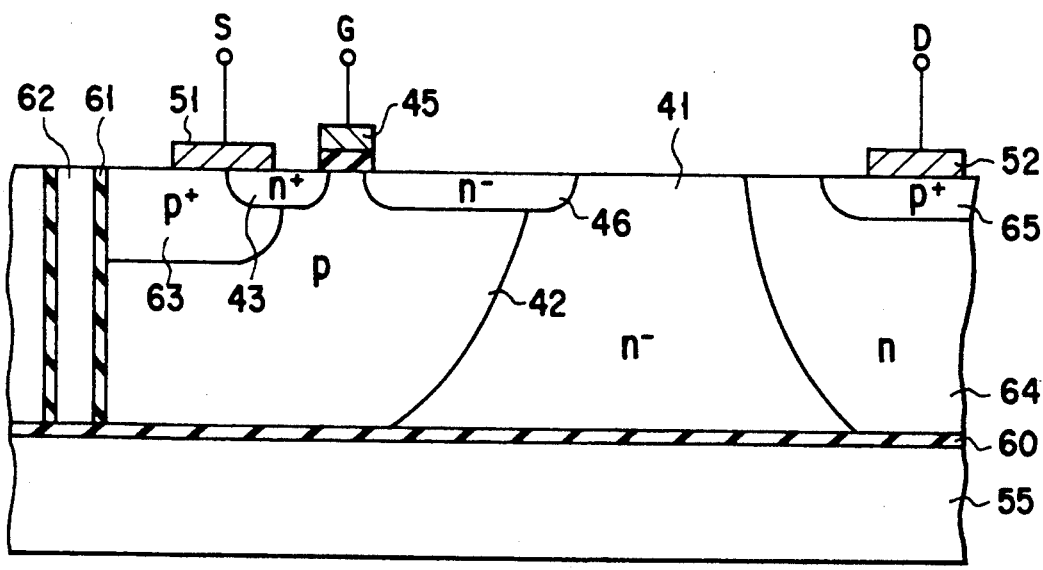
F I G. 32

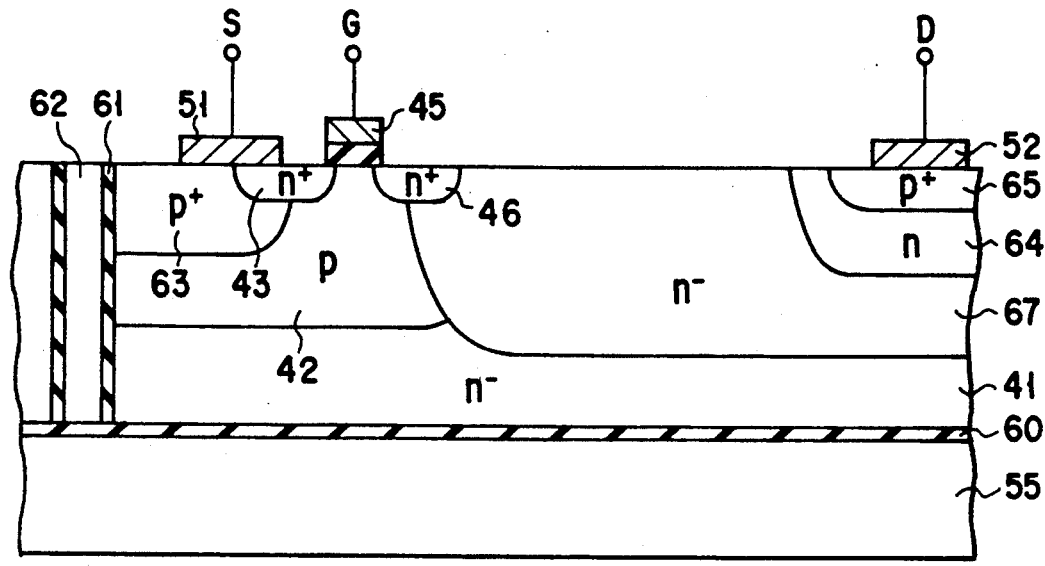
F I G. 33
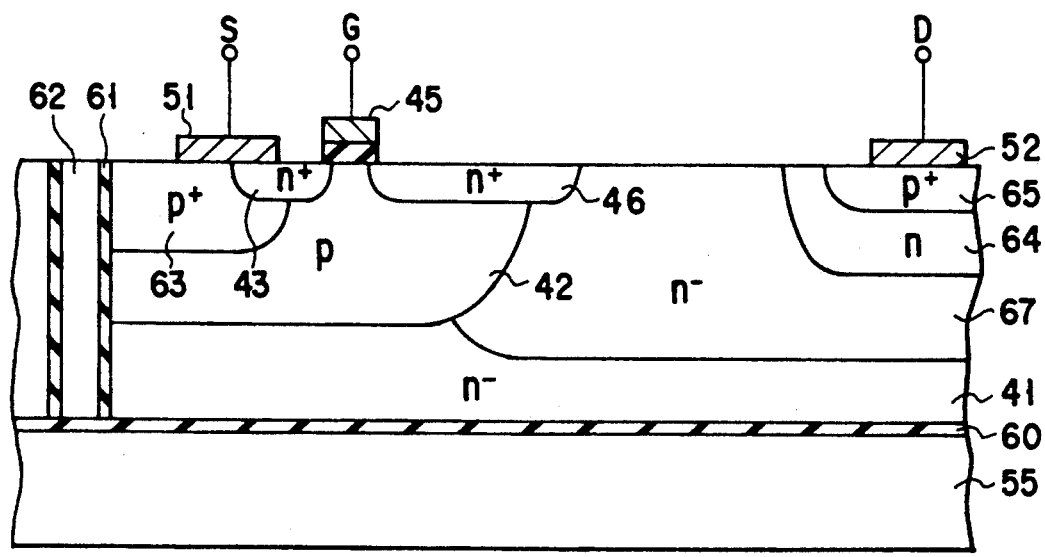
F I G. 34

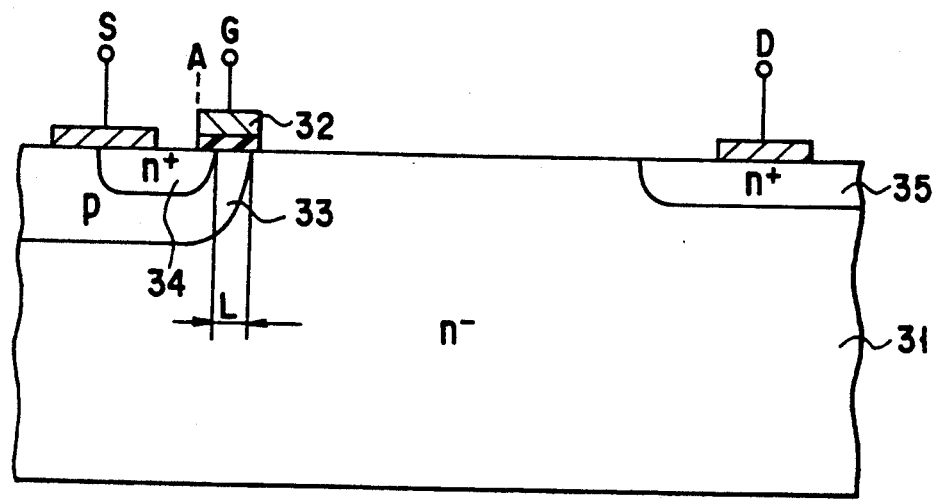
F I G. 39
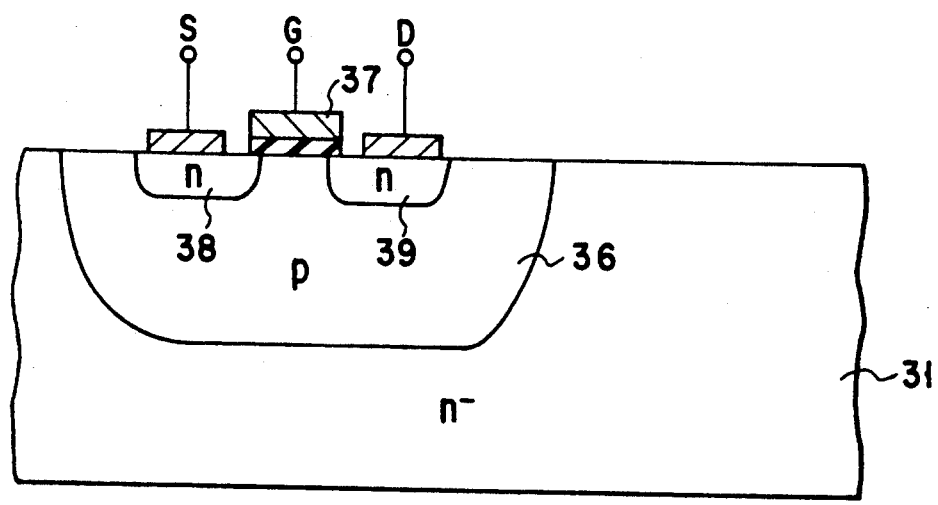
F I G. 40

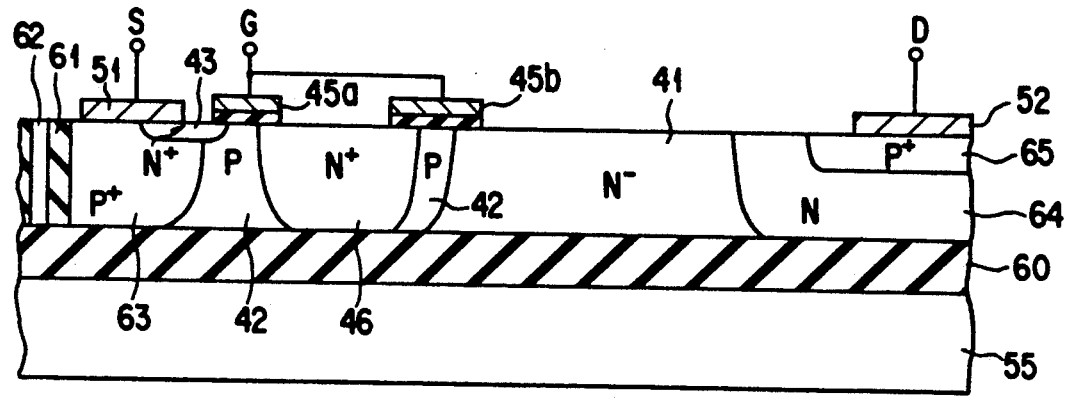
F I G. 41
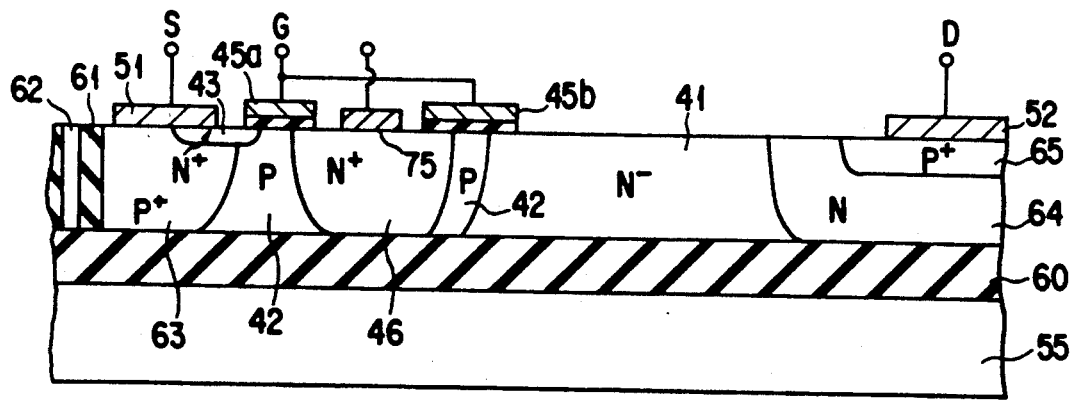
F I G. 42

THYRISTOR WITH INSULATED GATE

BACKGROUND OF THE INVENTION

1. Field of the Invention

The present invention relates to a thyristor with an insulated gate.

2. Description of the Related Art

In future, as a power device, there will be mainly used a power IC having a driving circuit and a protection circuit, which are integrally formed in the power device with a high breakdown voltage and a large current. A thyristor of the voltage control type using an insulted gate electrode (MOS gate) is suitable for gate driving in such a power device since gate driving can be performed by a small current as compared with the thyristor of the current driving type.

FIG. 25 shows the structure of a turn-off insulated gate in the conventional thyristor of the insulated gate type. A p-type base layer 2 is formed on one surface of an n-type base layer 1 having high resistance. An n-type emitter layer 3 is formed in the p-type base layer 2. A p-type emitter layer 4 is formed on the other surface of the n-type base layer 1. A cathode electrode 5 is formed on the n-type emitter layer 3 and an anode electrode 6 is formed on the p-type emitter layer 4.

An n-type drain layer 7 is formed at the position, which is away from the n-type emitter layer 3 at a predetermined distance. A gate electrode 10 is formed on the p-type base layer 2 via a gate insulating film 9, and between the n-type drain layer 7 and the n-type cathode layer 3. The gate electrode 10 is used for turn-off and comprises an n channel MOSFET in which the n-type emitter layer is used as a source. A drain electrode 8 is formed in contact with the p-type base layer 2, and the p-type base layer 2 and the n-type drain layer 7 are short-circuited by the drain electrode 8.

A gate electrode for turn-on (not shown) is formed at a peripheral portion of the p-type base layer 2, which is selectively diffused, and comprises a MOS structure similar to the gate electrode for turn-off.

According to the above-structured thyristor of the insulated gate type, a positive voltage with respect to the cathode is applied to the insulated gate electrode 10 at the time of turn-off. Thereby, an n-channel is formed under the gate electrode 10. Then, hole current, which has directly flowed into the n-type emitter layer 3 from the p-type base layer 2, changes its passages and flows into the drain electrode 8 as shown by a broken line, and passes through the n-type drain layer 7 and the portion under the gate electrode 10. Thus, the hole current is bypassed to the cathode electrode 5 from the n-type emitter layer 3. By the bypass of the hole current, injection of electrons to the p-type base layer 2 from the n-type emitter layer 3 is stopped, and the device is turned off.

In the conventional thyristor with the insulated gate, there is a problem in that sufficient turn-off capability cannot be obtained. This is due to resistance of a hole current bypass passage shown in FIG. 25. As resistance of the hole current bypass passage, there are mainly horizontal resistance of the p-type base layer 2 and on-resistance of the channel under the insulated gate electrode 10. If a voltage drop, which is determined by these resistance and the bypass current, becomes higher than a built-in voltage between the n-type emitter layer 3 and the p-type base layer 2, injection of electrons from the n-type emitter layer 3 is not stopped. Due to this, if the main current increases, the device cannot be turned off.

Among the integrated circuits (ICs) in which a plurality of semiconductor elements are integrated on one semiconductor substrate, an IC having high breakdown voltage is called a power IC. The power IC such as a power MOSFET, IGBT, etc., including a MOS gate, which is generally used as a high breakdown device has normally a DSA (diffusion self-alignment) structure to from a channel portion. This is a method in which a source diffusion layer and a channel diffusion layer having polarity opposite to each other are formed by using one end surface of the same polysilicon gate electrode as a diffusion window.

FIG. 39 shows a cross section of a horizontal type power MOSFET manufactured by the conventional technique. First, a polysilicon film, serving as a gate electrode 32, is used as a mask, and impurity is diffused into an n-type substrate 31 from the left side of position A to form a p-type channel layer 33. Then, impurity is diffused into the p channel layer 33 from the same place to form an n-type diffusion layer 34 serving as a source. At the same time, an n-type diffusion layer 35, serving as a drain, is formed by diffusion. Thereby, the horizontal power MOSFET is formed as shown in the drawing.

In the power IC, a low breakdown voltage device such as a CMOS for forming a logic circuit must be formed on the same substrate on which the high breakdown voltage device is formed. FIG. 40 shows a cross section of a low breakdown voltage MOSFET of n-channel type. First, a p-type well diffusion layer 36 is formed on the same n-type substrate 31 where the high breakdown voltage device is formed. Then, a polysilicon film, serving as a gate electrode 37, is used as a mask, and n-type diffusion layers 38 and 39, serving as a source and a drain, are formed on both sides. Thereby, the low breakdown voltage MOSFET is formed as shown in the drawing.

In the manufacturing process of the above high breakdown device and the low breakdown device, both p-type channel layer 33 of the high breakdown voltage device and p-type well diffusion layer 36 of the low breakdown voltage device are diffusion layers for forming a channel portion. It is, however, needed that these layers be formed in a different process for the following reason.

That is, the p-type channel of the high breakdown voltage device uses a horizontal diffusion region of the diffusion layer, and the p-type channel of the low breakdown voltage device uses a vertical diffusion region of the diffusion layer. Due to this, the layers 33 and 36 are basically different from each other in the amount of implant dose. Moreover, since the p-type channel of the high breakdown voltage device uses the horizontal diffusion region of the diffusion layer 33, the channel length L is determined by the depth of the diffusion. Due to this, it is needed that the diffusion depth in the high breakdown voltage device be independently designed of that in the low breakdown voltage device.

In the conventional horizontal type high breakdown voltage device used in the power IC, there is a problem in that the manufacturing process thereof is independent of that of the low breakdown voltage device to be simultaneously integrated, and the manufacturing process becomes complicated so as to integrate both devices on one chip.

SUMMARY OF THE INVENTION

According to the above-mentioned thyristor with an insulated gate, there is a problem in that a large conductive current cannot be supplied. An object of the present invention is to provide a thyristor with an insulated gate which can be supplied with a large current.

The thyristor with an insulated gate comprises a pnpn structure constituted by a first conductive type base layer having a high resistance, a second conductive type base layer formed on one surface of the first conductive type base layer, a second conductive type emitter layer connected to said second conductive type base layer via the first conductive type base layer, and a first conductive type emitter layer formed in the second conductive type base layer.

According to the first invention based on the basic structure, a drain electrode is formed on the second conductive type base layer at the position adjacent to the first conductive type emitter layer, and a first conductive type drain layer, which is short-circuited with the second conductive type base layer by the drain electrode, is also formed. In the second conductive type base layer, a first conductive source layer is formed at the position with a predetermined distance away from the first conductive type drain layer. An insulated gate electrode for turn-off is formed via the gate insulating film on the second conductive type base layer between the first conductive type drain layer and the first conductive type source layer. A first main electrode is formed on the second conductive type emitter layer, and a second main electrode is formed on the first conductive type emitter layer. A source electrode connected is formed on the first conductive type source layer and connected to the second main electrode.

According to the second invention based on the basic structure, the first conductive type emitter layer consists of a plurality of segments. A drain electrode is formed to be in contact with the second conductive type base layer at a position adjacent to one side of each segment of the first conductive emitter layer. A first conductive type drain layer, which is short-circuited with the second conductive base layer by the drain electrode, is formed at a position adjacent to another side of each segment of the first conductive type emitter layer. An insulated gate electrode for turn-off is formed between the first conductive type drain layer and the first conductive type emitter layer.

According to the third invention based on the basic structure, the first and second drain layers of the first conductive type are formed in the second conductive type base layer so as to sandwich the first conductive type emitter layer. An insulated gate electrode for turn-off is formed between the first conductive type emitter layer and the second drain layer. The first main electrode is formed on the second conductive type emitter layer and the second main electrode is formed on the first conductive type emitter layer. A short-circuit electrode for connecting the first and second drain layers is formed.

According to the conventional structure of FIG. 25, there is structured the turn-off MOSFET in which the n-type emitter layer is used as a source layer. Due to this, the drain electrode, through which the hole current flows, is formed away from the electrode of the n-type emitter layer. In contrast, according to the first invention, the n-type source layer of the turn-off MOSFET is formed independent of the n-type emitter layer, and the drain layer and the drain electrode are formed adjacent to the n-type emitter layer. The drain electrode, through which the hole current flows at the time of turn-off, is directly brought into contact with the p-type base layer at the portion close to the n-type emitter layer.

According to the second invention, the n-type source layer and the n-type emitter layer are used in common similar to the prior art. However, the n-type emitter layer is formed of a plurality of segments. A drain electrode is formed to contact the second conductive type base layer at the position adjacent to one side of the emitter layer. An n-type drain layer is formed at the position adjacent to another of the first conductive type emitter layer.

According to the third invention, n-type drain layers of turn-on and turn-off MOSFETs are arranged as first and second drain layers such that the n-type emitter layer is sandwiched therebetween. Thereby, the hole current at the time of turn-on directly flows into the cathode electrode without horizontally passing the portion under the n-type emitter layer.

Therefore, according to the thyristor with an insulated gate of the present invention, horizontal resistance of the p-type base layer has little effect on the hole current bypass passage at the time of turn-off, so that a large conductive current as compared with the prior art can flow and can be turned off.

In other words, according to the present invention, there can be provided the thyristor with an insulated gate, which can supply a large current by reducing a voltage drop of the current bypass passage in an ON state in view of the layout of the diffusion layers, the gate electrode and so forth.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 shows a layout of a thyristor on a cathode side according to a second embodiment of the present invention;

FIG. 4 shows a layout of a thyristor on a cathode side according to a third embodiment of the present invention;

FIG. 7 is a cross sectional view taken along line VII—VII of FIG. 6;

FIG. 12 shows a layout of a thyristor on a cathode side according to a seventh embodiment of the present invention;

FIG. 15 shows a layout of a thyristor on a cathode side according to an eighth embodiment of the present invention;

FIG. 21 is a cross sectional view showing a thyristor according to a tenth embodiment of the present invention;

FIG. 26 is a cross sectional view showing a horizontal type high breakdown voltage MOSFET according to a thirteenth embodiment of the present invention;

FIG. 28 is a cross sectional view showing a horizontal type high breakdown voltage MOSFET according to a fourteenth embodiment of the present invention;

FIG. 31 is a cross sectional view showing a horizontal type high breakdown voltage IGBT according to a sixteenth embodiment of the present invention;

FIG. 32 is a cross sectional view showing a horizontal type high breakdown voltage IGBT according to a seventeenth embodiment of the present invention;

FIG. 33 is a cross sectional view showing a horizontal type high breakdown voltage IGBT according to an eighteenth embodiment of the present invention;

FIG. 34 is a cross sectional view showing a horizontal type high breakdown voltage IGBT according to an nineteenth embodiment of the present invention;

FIG. 39 is a cross sectional view showing a conventional high breakdown voltage MOSFET;

FIG. 40 is a cross sectional view showing a conventional low breakdown voltage MOSFET;

FIG. 41 is a cross sectional view showing an EST (Emitter Switching Thyristor) according to the twenty-fourth embodiment of the present invention; and FIG. 42 is a cross sectional view showing an EST according to the twenty-fifth embodiment of the present invention.

DETAILED DESCRIPTION OF THE PREFERRED EMBODIMENT

The embodiments of the present invention will be explained with reference to the drawings.

Figure 1:
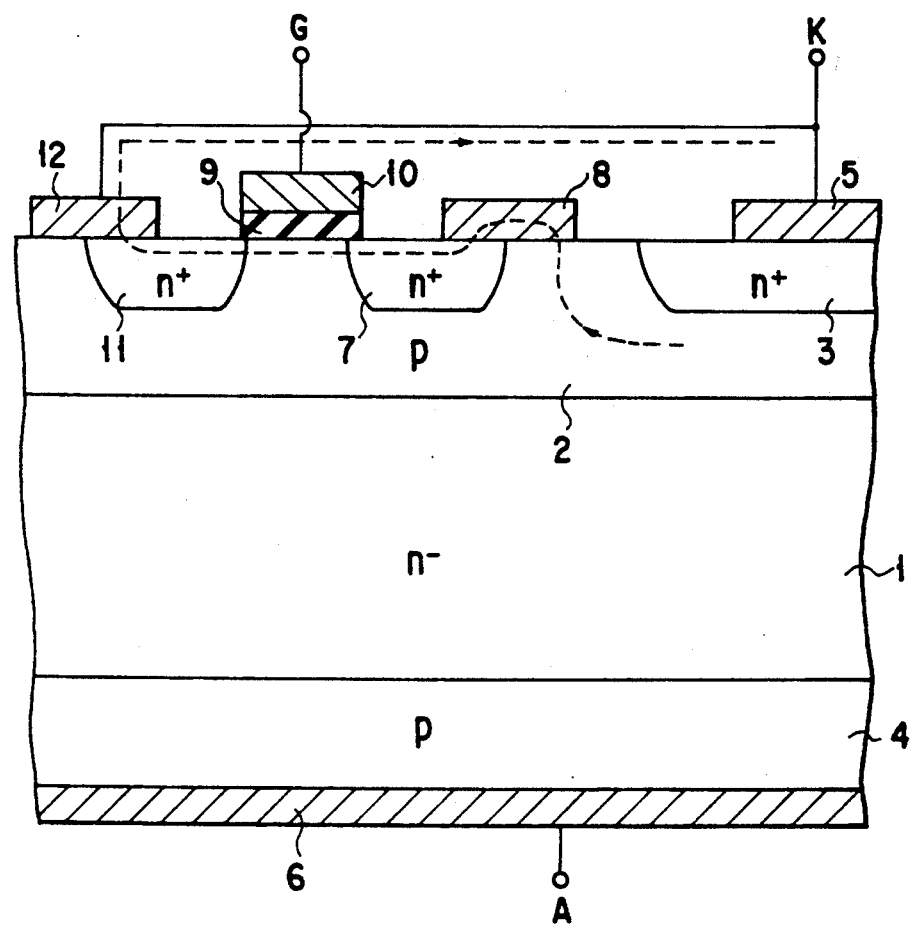
FIG. 1 is a cross sectional view showing a thyristor with an insulated gate according to a first embodiment of the present invention.
Figure 25:
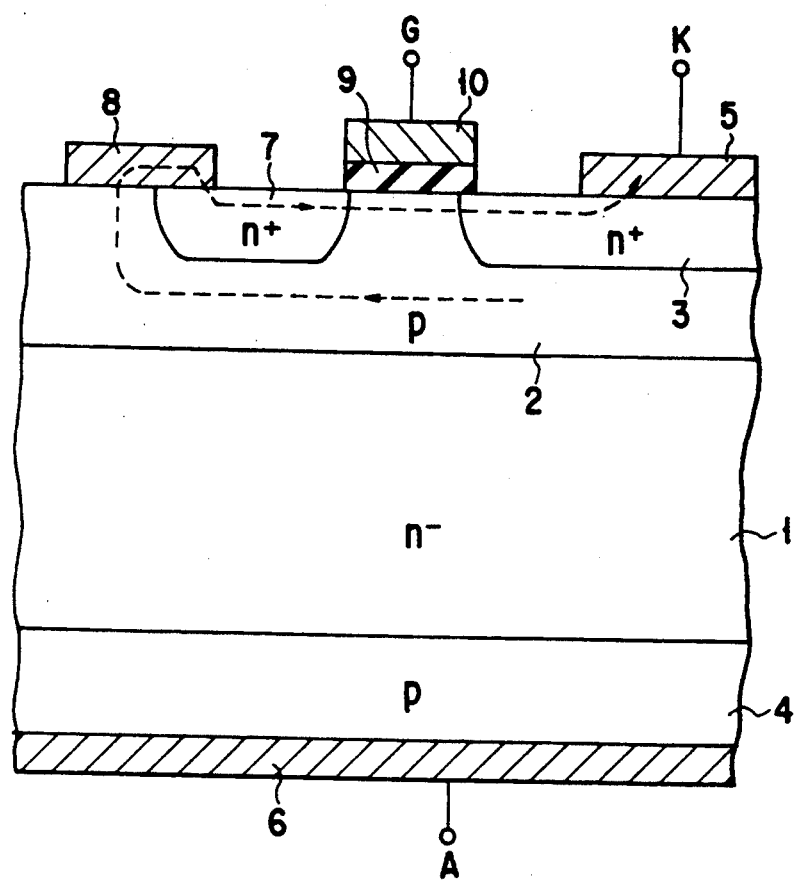
FIG. 25 is a cross sectional view showing a conventional thyristor with an insulated gate.

FIG. 1 shows the structure of a turn-off gate of the thyristor with an insulated gate according to the first embodiment of the present invention. The same reference numerals as the prior art of FIG. 25 are added to the portions corresponding to those of the prior art of FIG. 25, and the detail explanation will be omitted. As is obvious from the comparison between the first embodiment of the present invention and the prior art of FIG. 25, an drain electrode 8 is formed to be in contact with a p-type base layer 2 at the position adjacent to an n-type emitter layer 3 according to this embodiment. An n-type drain layer 7 is short-circuited with the p-type base layer 2 by the drain electrode 8. An n-type source layer 11 is formed at the position, which is a away from the n-type drain layer 7 at a predetermined distance. An insulated gate electrode 10 is formed between the drain layer 7 and the source layer 11. A source electrode 12 is integrally formed with a and electrically connected to the cathode electrode 5. According to this embodiment, similar to the drain electrode 8, the source electrode 12 is formed to be in contact with the p-type base layer 2 as well as the source layer 11. The source electrode 12 may be formed to be in contact with only the source layer 11.

According to the thyristor with an insulated gage of this embodiment, a positive voltage with respect to the cathode is applied to the insulated gate electrode 10 at the time of turn-off. In this case, a bypass passage of a hole current is shown by a broken line. As shown in the drawing, a part of the hole current flows into the drain electrode 8 at a portion right close to the n-type emitter layer 3 and passes through the channel under the gate electrode 10, and is supplied to the source electrode 12, and thus the cathode electrode 5.

As is obvious from the comparison between the structure of this embodiment and the conventional structure of FIG. 25, little horizontal resistance of the p-type base layer 2 enters the hole current bypass passage. Therefore, the voltage drop due to the hole current to be bypassed is small as compared with the conventional structure, so that a high turn-off capability can be obtained.

In view of the point that a logic circuit is integrated, a horizontal type thyristor using a semiconductor substrate having a dielectric isolation structure is suitable for a power IC. The present invention can be applied to the such a horizontal type thyristor with an insulated gate. The following will explain the embodiment of the horizontal type thyristor with an insulated gate. In the following embodiment, the same reference numerals as FIG. 1 are added to the portions corresponding to those of FIG. 1, and the detail explanation will be omitted.

Figure 3:
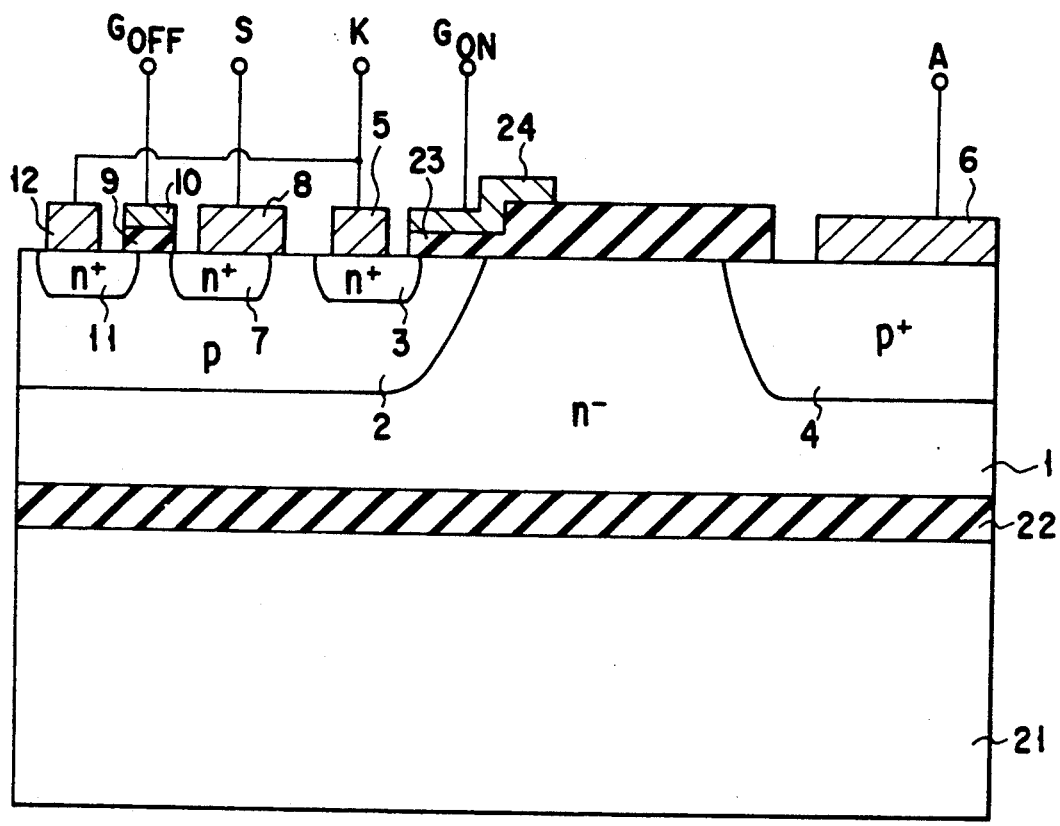
FIG. 3 is a cross sectional view taken along line III—III of FIG. 2.

FIG. 2 shows a layout of a thyristor on a cathode side according to the second embodiment of the present invention, and FIG. 3 is a cross sectional view taken along line III—III of FIG. 2. An n-type base layer 1 is formed on a silicon substrate 21 with an oxide film 22 interposed therebetween. This structure can be obtained by, for example, a technique in which two silicon substrates are directly adhered. A p-type base layer 2 and a p-type emitter layer 4, which are opposite to each other, are formed in a striped form, on the surface of the n-type base layer 1 with a predetermined distance. In the p-type base layer 2, an n-type emitter layer 3 having a striped pattern, an n-type drain layer 7, and an n-type source layer 11 are formed. A drain 8 is formed in a striped pattern so as to be in contact with the n-type drain layer 7 as well as the p-type base layer 2 at a portion, which is right close to the n-type emitter layer 3. A turn-off insulated gate electrode 10 having a striped pattern is formed between the n-type drain layer 7 and the n-type source layer 11. The cross sectional structure of the turn-off MOSFET is the same as the embodiment of FIG. 1.

A gate electrode 24 is formed in a striped pattern on a region of the p-type base layer 2, which is sandwiched by the n-type emitter layer 3 and the n-type base layer 1, via a gate insulating film 23. The gate electrode 24 is a turn-on gate electrode, which has been omitted in the embodiment of FIG. 1.

The cathode electrode 5 and the source electrode 12 are integrally formed such that they are coupled to each other at the peripheral portion as shown in FIG. 2.

According to the horizontal type thyristor with an insulated gate of this embodiment, a positive voltage is applied to the gate electrode 24 at the time of turn-on while the gate electrode 10 is set to zero or negative bias. Thereby, electrons are injected into the n-type base layer 1 from the n-type emitter layer 3 via the n-type channel formed under the gate electrode 24, and the holes corresponding to the amount of the electrons are supplied to the n-type base layer 1 from the p-type emitter layer 4, and turned on. At the time of turn-off, a positive voltage is applied to the gate electrode 10 while the gate electrode 24 is set to zero or negative bias. Thereby, similar to the previous embodiment, the hole current is bypassed and the device is turned off.

Similarly, in this embodiment, since the drain electrode 8 is arranged at the position adjacent to the n-type emitter layer 3, the large current can be turned off.

FIG. 4 is an layout of a thyristor of the third embodiment of the present invention in which the embodiment of FIG. 2 is modified. According to this embodiment, the n-type emitter layer 3 is divided into a plurality of portions, and parts of the drain electrode 8 are inserted to divided space regions in the form of a comb, and are brought into contact with the p-type base layer 2.

According to this embodiment, the voltage drop due to the horizontal resistance of the p-type base layer under the n-type emitter layer 3 can be reduced, and a higher turn-off capability can be obtained.

Figure 5:
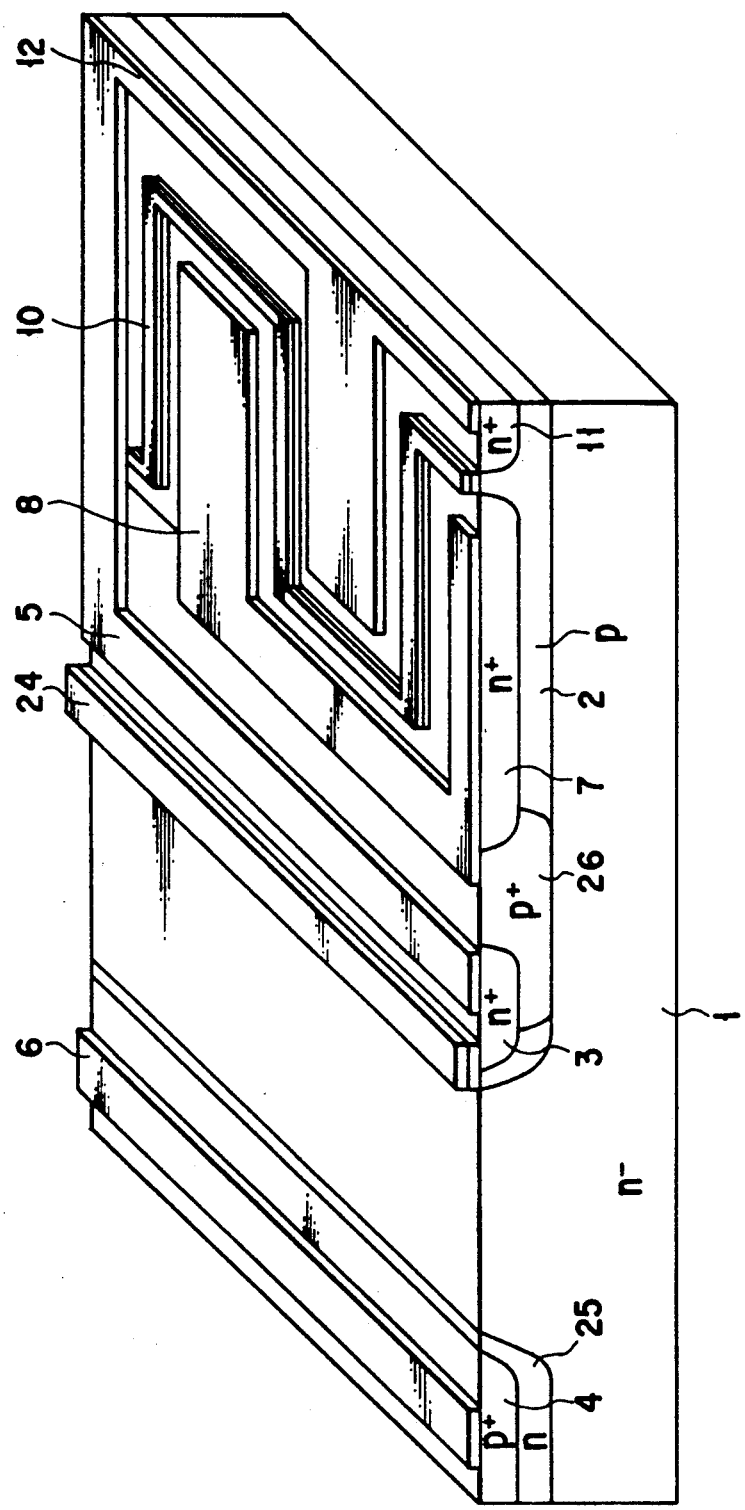
FIG. 5 is a perspective view of a thyristor according to a fourth embodiment of the present invention.

FIG. 5 is a perspective view of the horizontal type thyristor with an insulated gate of the fourth embodiment of the present invention. According to this embodiment, the turn-off gate electrode 10 is formed in a zig-zag pattern, and the channel width of the turn-off MOSFET can be sufficiently long ensured. Also, an n-type buffer layer 25 is formed around the p-type emitter layer 4 so as to obtain a high breakdown voltage. A p-type layer 26 having a high impurity concentration is formed between the n-type emitter layer 3 and the n-type drain layer 7 so as to obtain a low resistance.

According to this embodiment, the voltage drop due to the horizontal resistance of the p-type base layer under the n-type emitter layer 3 can be reduced, and a higher turn-off capability can be obtained.

In the above-mentioned embodiments, the n-type source layer is formed separately from the n-type emitter layer, the hole current flowing from the drain electrode is supplied to the cathode via the MOS transistor and the source layer. The following embodiments explain improvement of the conventional structure in which the n-type emitter layer and the n-type source are used in common.

Figure 6:
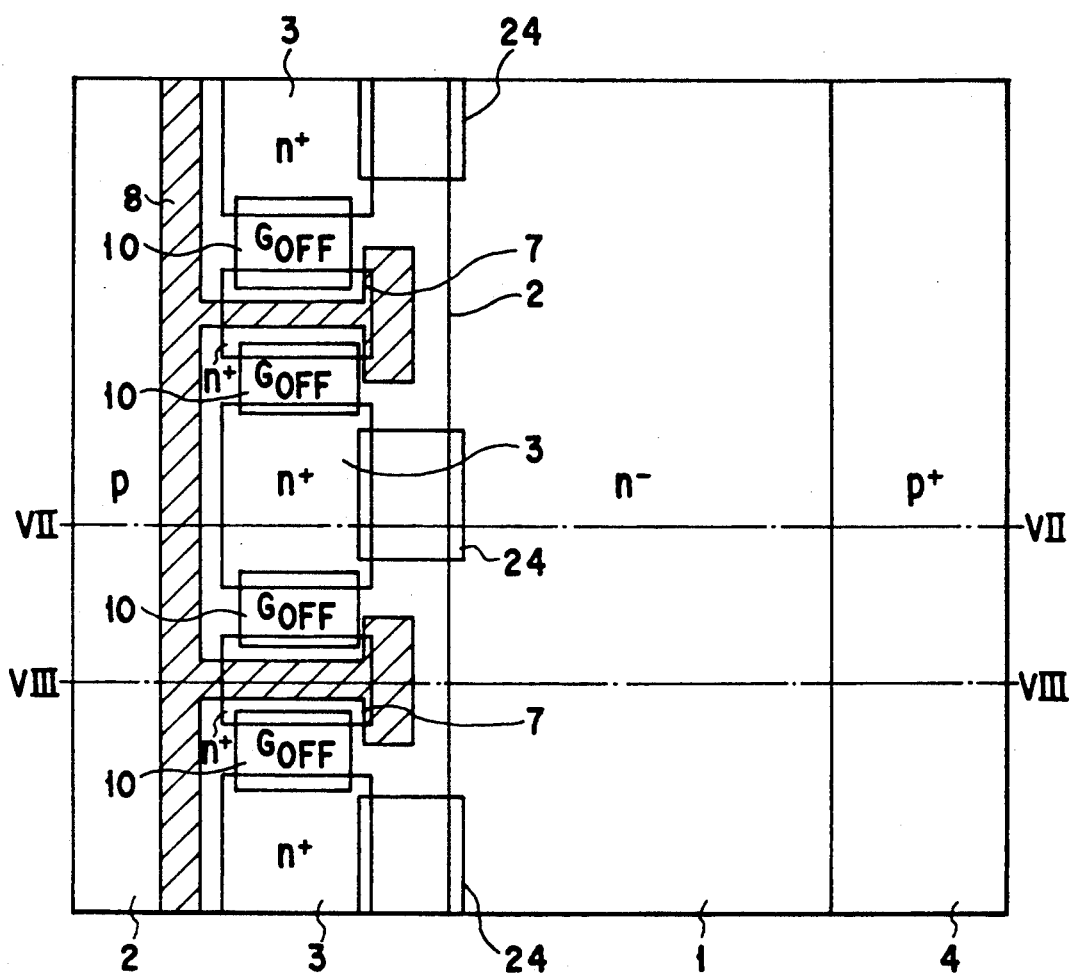
FIG. 6 shows a layout of a thyristor on a cathode side according to a fifth embodiment of the present invention.
Figure 8:
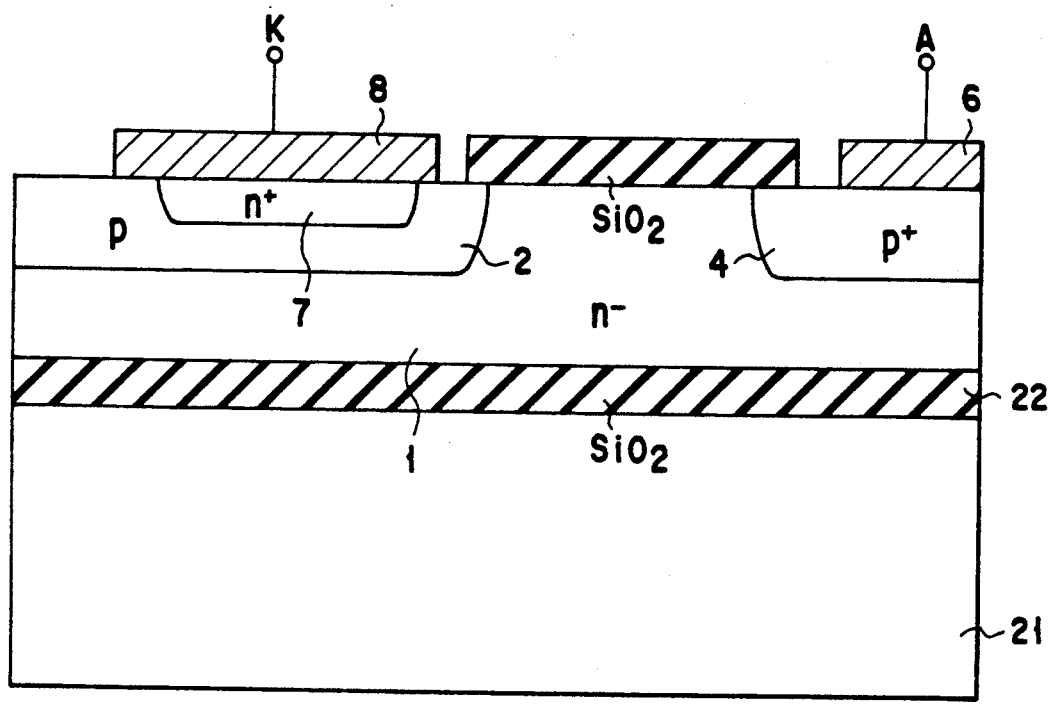
FIG. 8 is a cross sectional view taken along line VIII—VIII of FIG. 6.

FIG. 6 shows a layout of a thyristor on a cathode side according to a fifth embodiment of the present invention. FIGS. 7 and 8 are cross sectional views taken along lines VII—VII and VIII—VIII of FIG. 6, respectively. Similar to the previous embodiments, the dielectric isolation substrate is used in this embodiment. According to this embodiment, the n-type emitter layer 3 is divided into a plurality of portions in the p-type base layer 2. The n-type drain layer 7 consisting of a plurality of separated portions is formed such that each portion is arranged in the region, which is sandwiched by the respective n-type emitter layers 3. The insulated gate electrode 10 consisting of a plurality of separated portions, which constituting the turn-off MOSFET, is formed such that each portion is arranged between each portion of the n-type drain layer 7 and the n-type emitter layer 3.

The drain electrode 8 is arranged to be parallel with the the arrangement of the n-type emitter layer 3 and the turn-off MOSFET. That is, the drain electrode 8 directly comes in contact with the p-type base layer 2 at the position adjacent to the side different from the side on which the turn-off MOSFET of the n-type emitter layer 3 is formed. The striped drain electrode 8 is arranged to cross the n-type drain layer 7 in a branch state, and brought into contact with the n-type drain layer 7.

The turn-on insulated gate electrode 24 consisting of a plurality of separated portions formed on the p-type base layer 24 between the divided n-type emitter layers 3 and the n-type base layer 1. The drain electrode 8 is brought into contact with the p-type base layer 2 even in a divided space region between the portions of the turn-off insulated gate 24.

Therefore, according to this embodiment, at the time of turn-off, the hole current flows into is supplied to the drain electrode 8 from the p-type base layer 3 at the position right close to one side of the n-type emitter 3, and sent to the cathode via the channel of the turn-off MOSFET. Therefore, the large current can be turned off.

Figure 9:
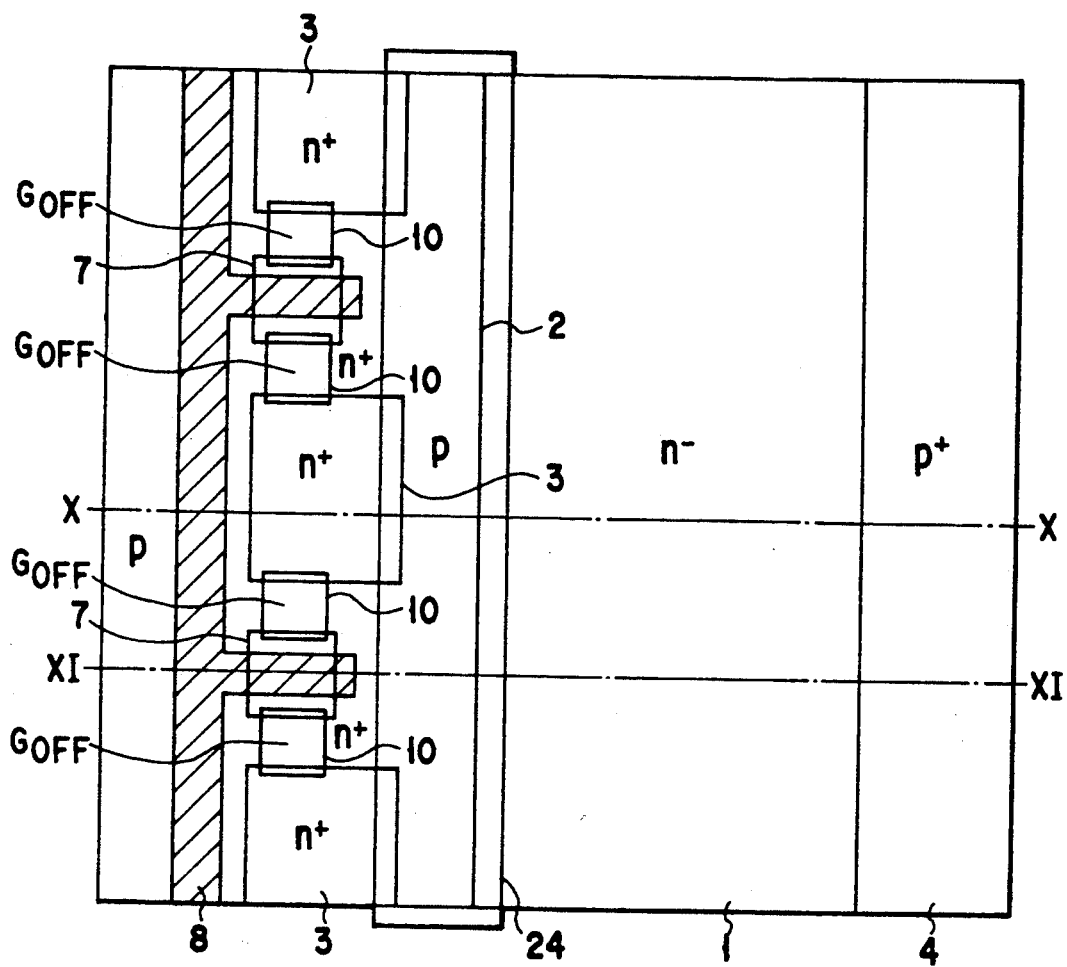
FIG. 9 shows a layout of a thyristor on a cathode side according to a sixth embodiment of the present invention.
Figure 10:
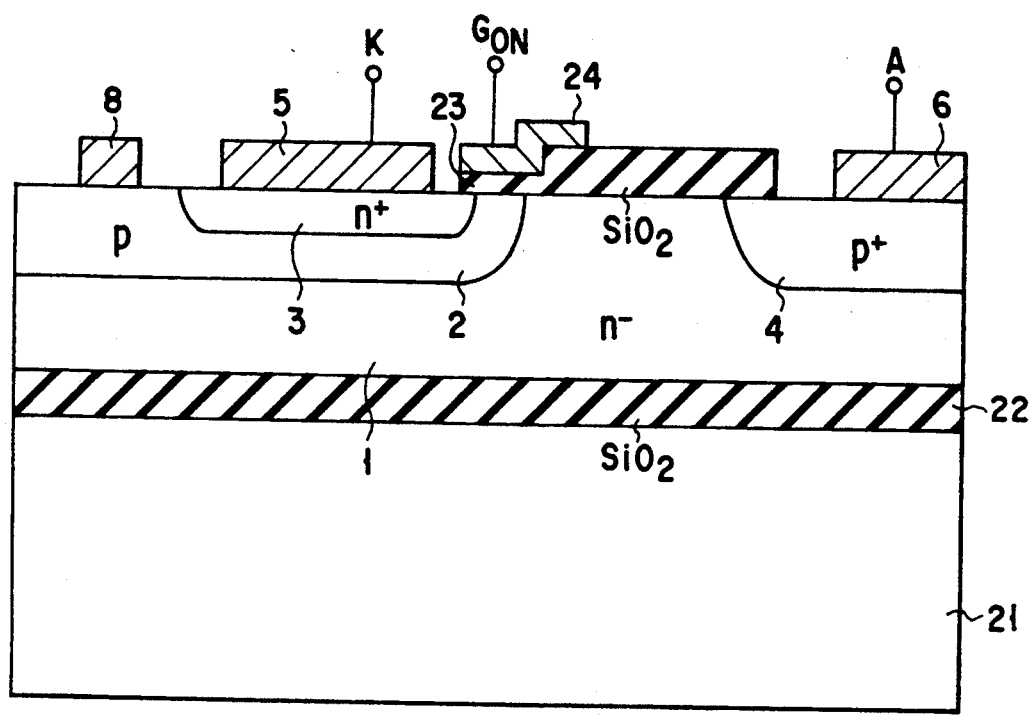
FIG. 10 is a cross sectional view taken along line X—X of FIG. 9.
Figure 11:
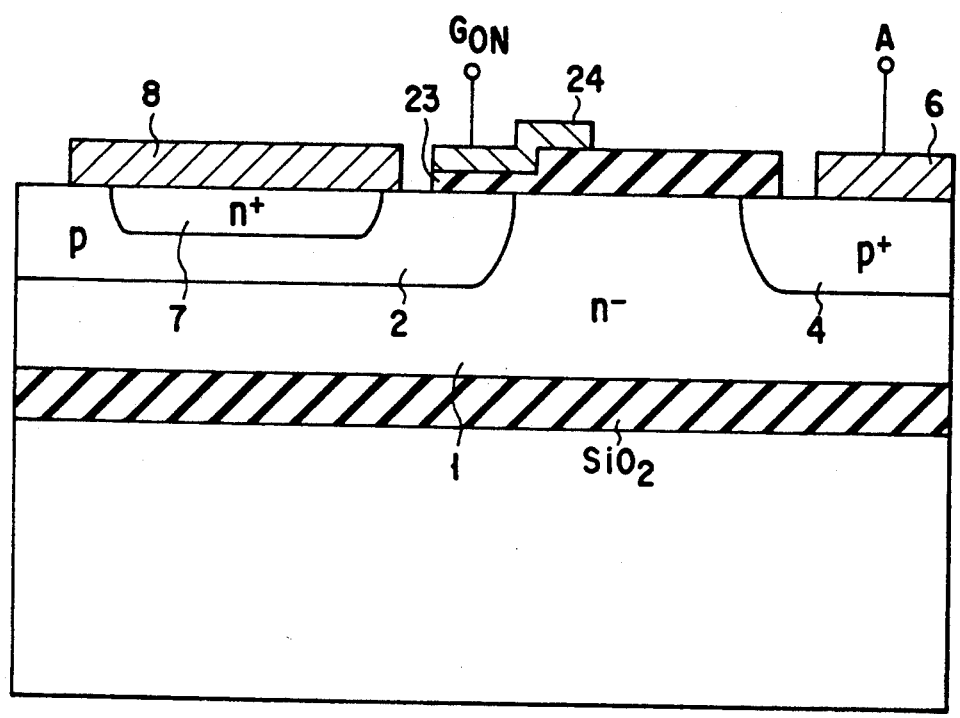
FIG. 11 is a cross sectional view taken along line XI—XI of FIG. 9.
Figure 13:
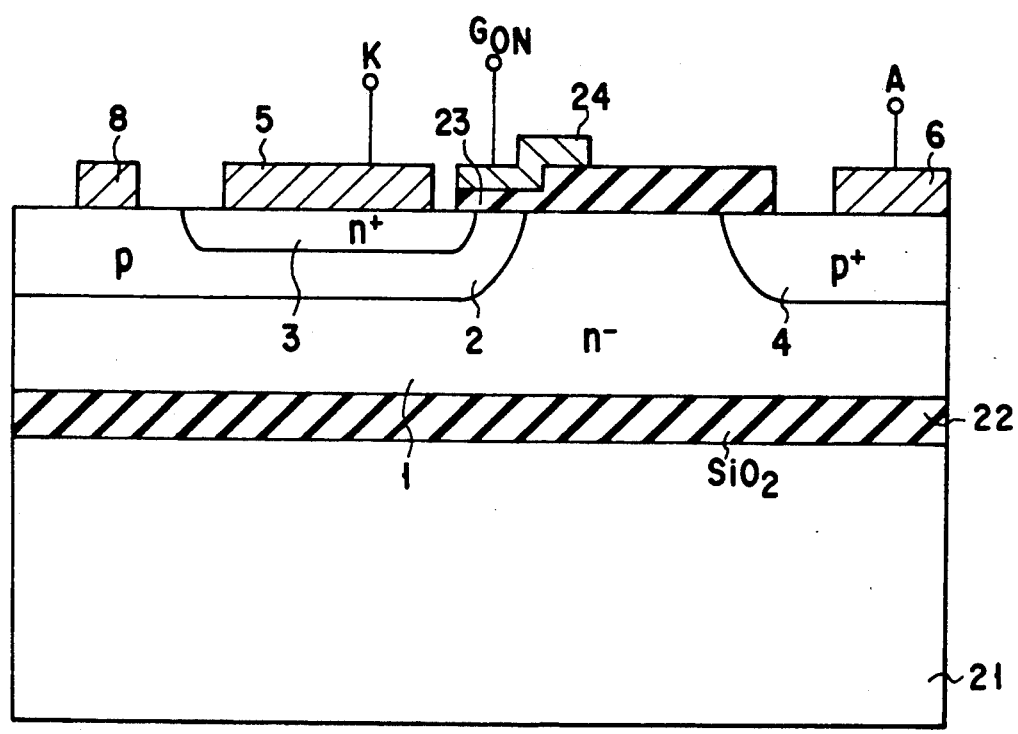
FIG. 13 is a cross sectional view taken along line XIII—XIII of FIG. 12.
Figure 14:
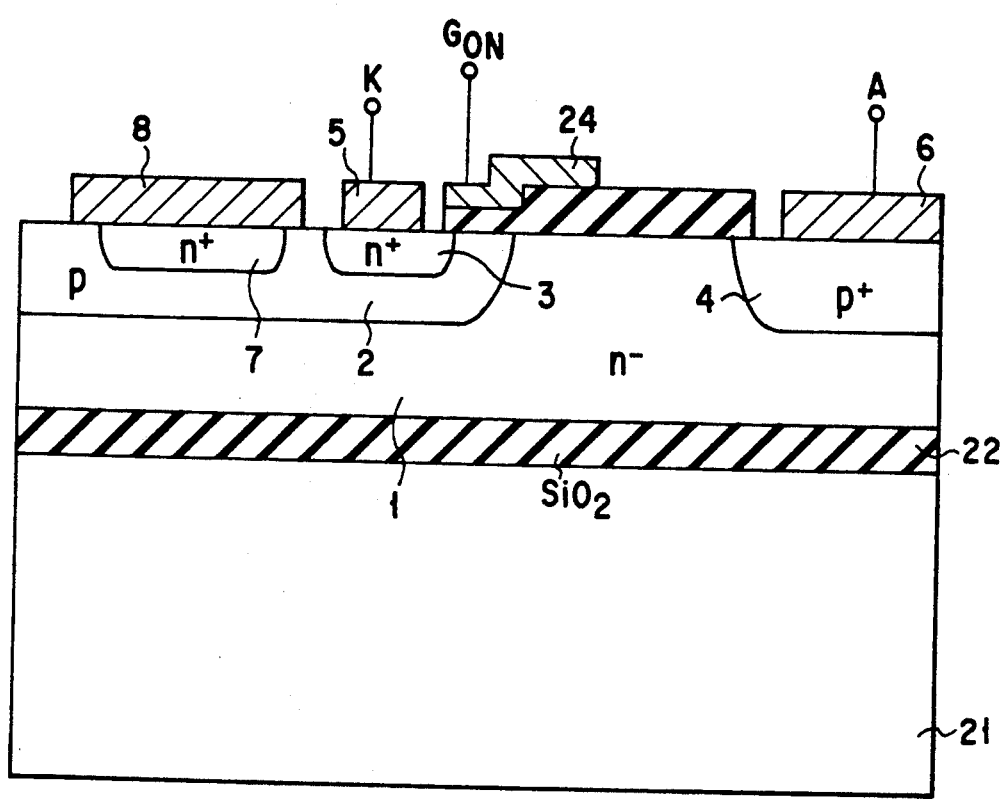
FIG. 14 is a cross sectional view taken along line XIV—XIV of FIG. 12.

FIGS. 9 to 11 show the layout of the sixth embodiment of the present invention in which the embodiment of FIGS. 6 to 8 is modified, and cross sectional views taken along lines X—X and XI—XI of FIG. 9, respectively. In this embodiment, the turn-on insulated gate electrode 24 is arranged in a striped form without being divided. According to this embodiment, the same technical advantage as the previous embodiment can be obtained. FIG. 12 to 14 show the layout of the seventh embodiment of the present invention in which the embodiment of FIGS. 6 to 8 is modified, and cross sectional views taken along lines XIII—XIII and XIV—XIV of FIG. 12, respectively. In this embodiment, the island n-type emitter layer 3 is not completely divided into portions. Instead, the emitter layer is formed to be continuous at the end portion near the p-type base layer 2. The turn-on insulated gate electrode 24 is formed in s striped pattern at the end portion of the p-type base layer 2.

In the embodiment of FIGS. 6 to 8, since the n-type emitter layers is completely divided into a plurality of portions, the channel width of the turn-on MOSFET is reduced by the division. This cannot be changed even if the gate electrode 24 is formed in the striped pattern as shown in the embodiment of FIGS. 9 to 11. In contrast, according to this embodiment, the channel width of the turn-on MOSFET can be sufficiently largely formed, and the turn-on characteristic can be prevented from being deteriorated when the divided emitter structure is used.

Figure 16:
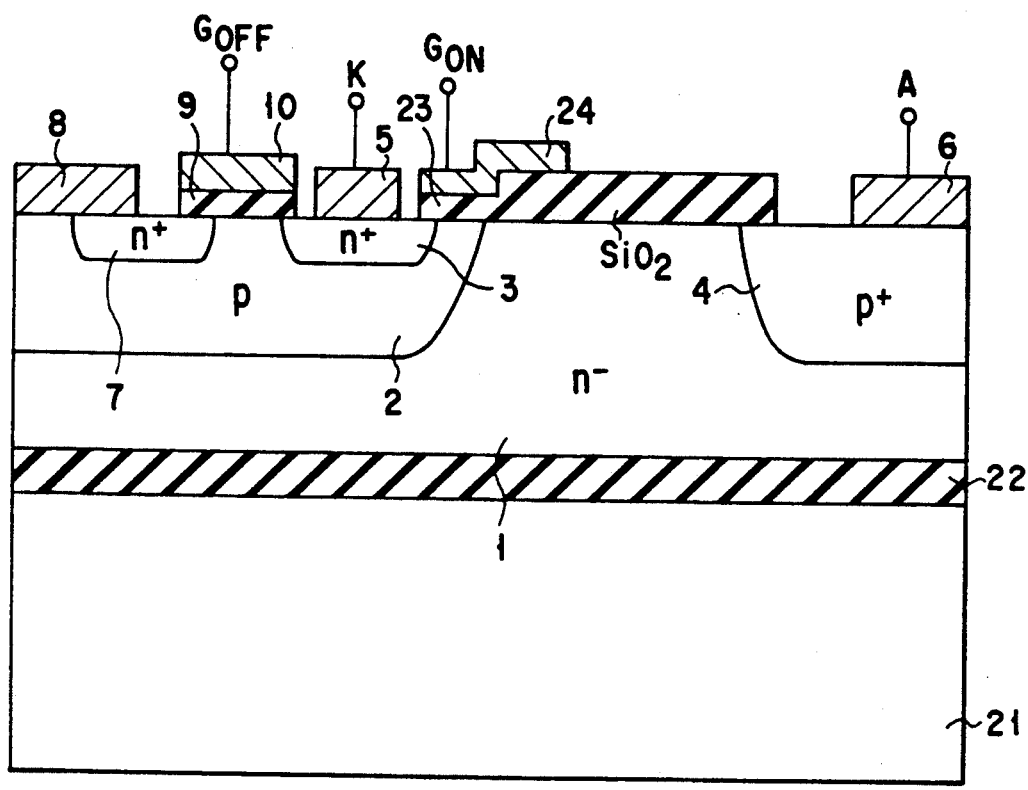
FIG. 16 is a cross sectional view taken along line XVI—XVI of FIG. 15.
Figure 17:
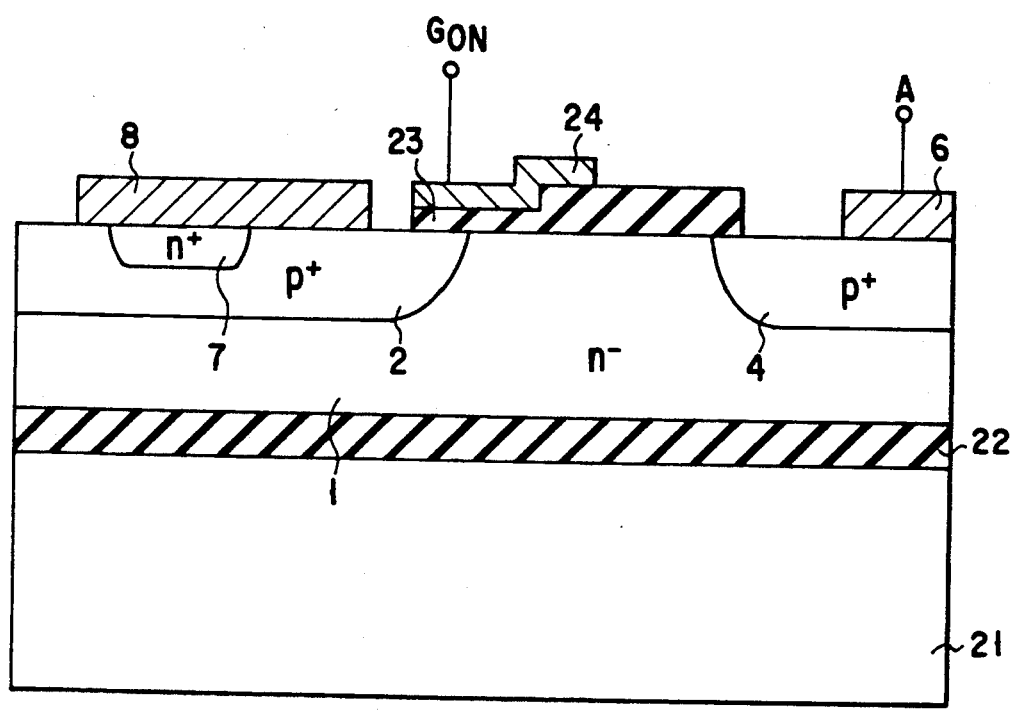
FIG. 17 is a cross sectional view taken along line XVII—XVII of FIG. 15.

FIGS. 15 to 17 show the layout of the thyristor with an insulated gate of the eighth embodiment of the present invention, and cross sectional views taken along lines XVI—XVI and XVII—XVII of FIG. 15, respectively. According to this embodiment, in view of the contact position, the relationship between the turn-off MOSFET and the divided n-type emitter layer 3 and the relationship between the drain electrode 8 and the p-type base layer 2 are opposite in terms of the contact position. More specifically, the n-type drain layer 7 is formed in a striped form to be parallel with the divided n-type emitter layer 3. The drain electrode 8 contacting the n-type drain layer 7 is formed in a striped form along the the n-type drain layer 7. Also, the drain electrode 8 is inserted into regions between separated portions of the n-type emitter layer 3 such that the drain electrode 8 is branched. Then, the drain electrode 8 is brought into contact with the p-type base layer 2 in the region sandwiched by the separated portions of the n-type emitter layers 3.

According to this embodiment, since the drain electrode 8, which is adjacent to two sides of the n-type emitter layer 3, comes in contact with the p-type base layer 2, a turn-off capability, which is much higher than the previous embodiment, can be obtained.

Figure 18:
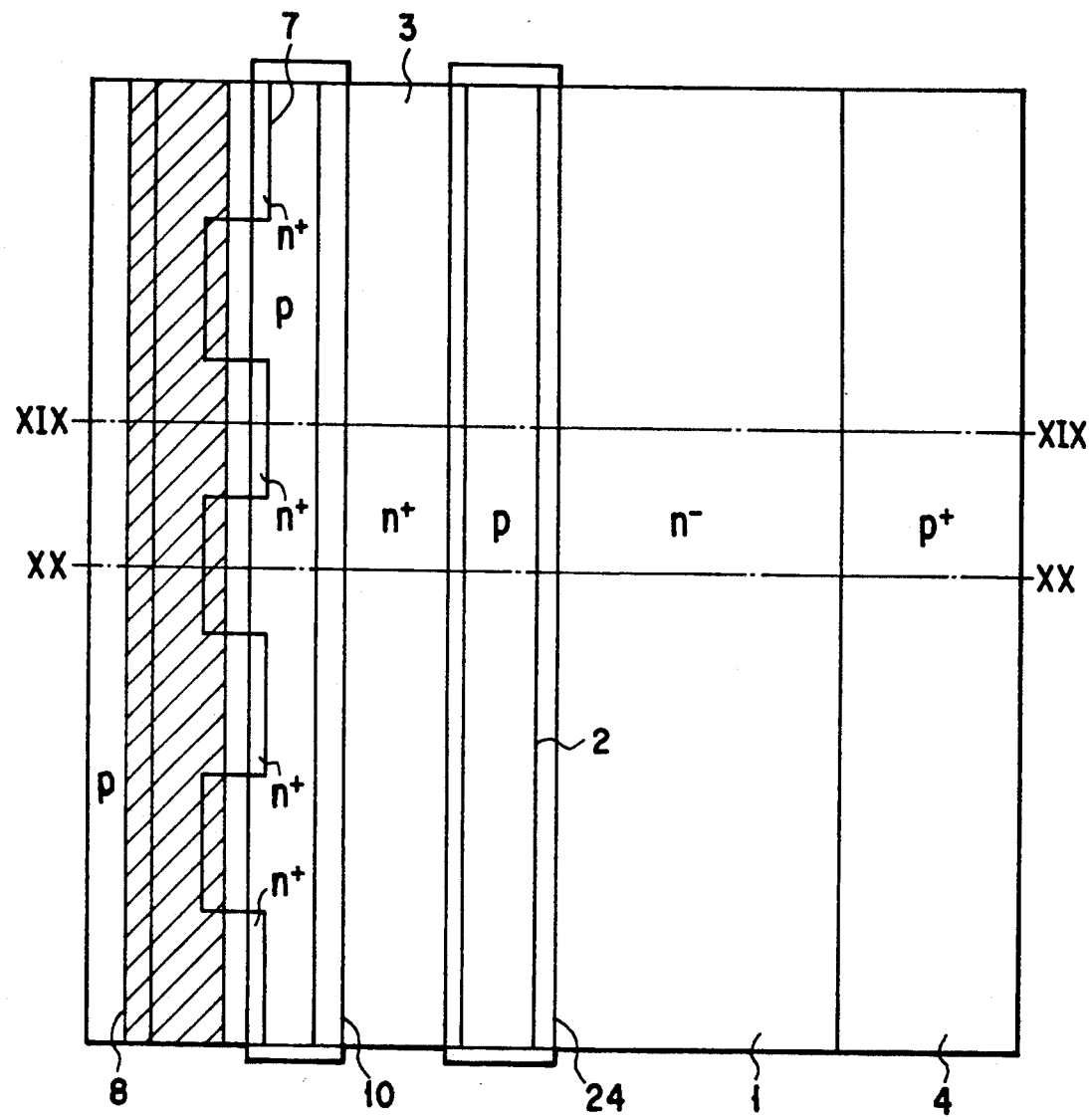
FIG. 18 shows a layout of a thyristor on a cathode side according to an ninth embodiment of the present invention.
Figure 19:
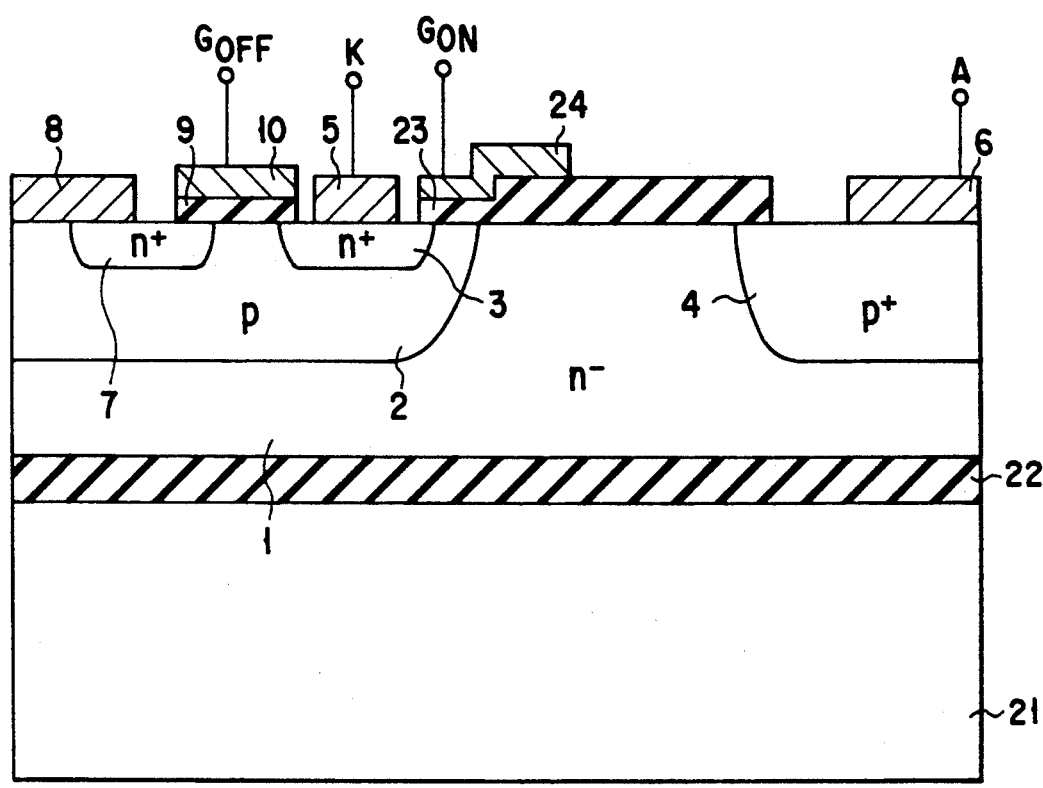
FIG. 19 is a cross sectional view taken along line XIX—XIX of FIG. 18.
Figure 20:
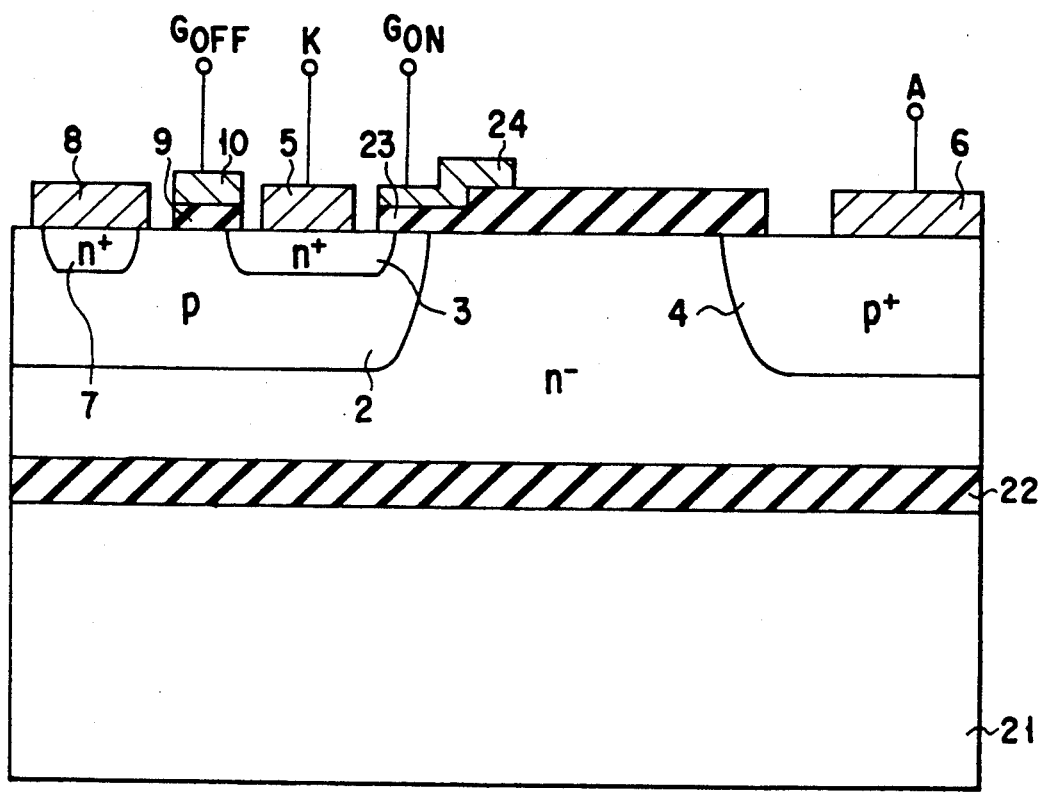
FIG. 20 is a cross sectional view taken along line XX—XX of FIG. 18.

FIGS. 18 to 20 show the layout of the thyristor with an insulated gate of the ninth embodiment of the present invention, and cross sectional views taken along lines XIX—XIX and XX—XX of FIG. 18, respectively. According to this embodiment, the n-type emitter layer 3 is formed in a striped pattern. The n-type drain layer 7 is formed in the concave and convex pattern on the side of its n-type emitter layer 3. The turn-off insulated gate electrode 10 is formed such that the electrode 10 covers only the convex portions of the n-type drain layer 7, and the turn-off MOSFET is formed in only the convex portions (FIG. 19). In other words, the turn-off MOSFET is substantially formed irregularly. The convex portions of the n-type drain layer 7 are not covered with the gate electrode 10 (FIG. 20). The drain electrode 8, which is formed in the striped pattern, is brought into contact with the p-type base layer 2 at exposed regions, which are not covered with the gate electrode 10.

According to this embodiment, at the time of turn-off, the hole current flows into the drain electrode 8 from the p-type base layer 2 without horizontally flowing through a portion under the n-type drain layer 7 where no turn-off MOSFET is substantially formed. Therefore, even in this embodiment, the hole current can flow without generating large voltage drop at the time of turn-off, and a high turn-off capability can be obtained.

The above embodiments are explained to be applied to the horizontal type thyristor, excepting the embodiment of FIG. 1. However, the structure of the above embodiments may be applied to the vertical type thyristor. In the horizontal type thyristor of the above embodiments, the dielectric isolation substrate is used. A pn junction isolation, however, can be used. Moreover, it is needless to say that the present invention can be applied to a single thyristor. Furthermore, various modifications can be made. For example, an n-type buffer layer may be formed near the p-type base layer in the n-type base layer having high resistance or a turn-off speed is increased by short-circuiting the emitter to the base by use of a transistor structure.

FIG. 21 is the layout of the thyristor with an insulated gate of the tenth embodiment of the present invention. In this embodiment, the n-type first drain layer 7a and second drain layer 7b are formed at portions adjacent to both sides of the n-type emitter layer 3. The n-type emitter layer 3 is short-circuited with the p-type base layer 2 by the cathode electrode 5. The gate electrode 10 is formed on the p-type base layer 2 between the n-type emitter layer 3 and the second drain layer 7b via the gate insulating film 9. The drain electrode 8a, which is formed on the first drain layer 7a, and the drain electrode 8b, which is formed on the second drain layer 7b, are connected to each other and used as a short-circuited electrode. The drain electrode 8a of the first drain layer 7a contacts only the first drain layer 7a, while the drain electrode 8b of the second drain layer 7b contacts not only the first drain layer 7a but also the p-type base layer 2.

According to the thyristor with an insulated gate of this embodiment, the positive voltage with respect to the cathode is applied to the gate electrode 10 in addition to a trigger gate electrode (not shown) at the time of turn-on. In this case, the passage of the electronic current is shown by a broken line. On the other hand, at the time of turn-off, the hole current directly flows from the p-type base layer 2 to the cathode electrode 5 at a portion right close to the n-type emitter layer, as shown by a chain line. According to this embodiment, the horizontal resistance of the p-type base layer 2 under the n-type emitter layer 3 does not enter the hole current bypass passage, and a high turn-off capability can be obtained.

Figure 22:
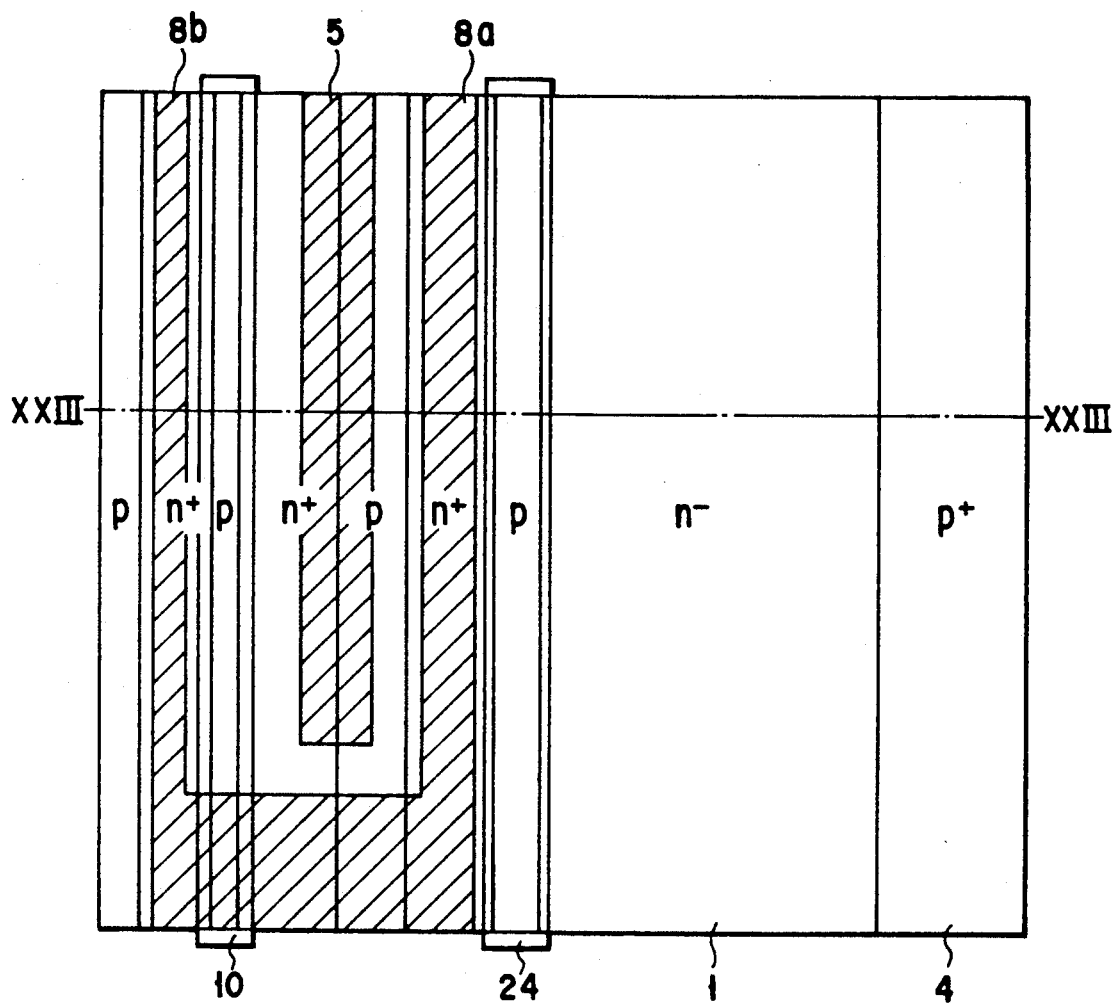
FIG. 22 shows a layout of a thyristor on a cathode side according to an eleventh embodiment of the present invention.
Figure 23:
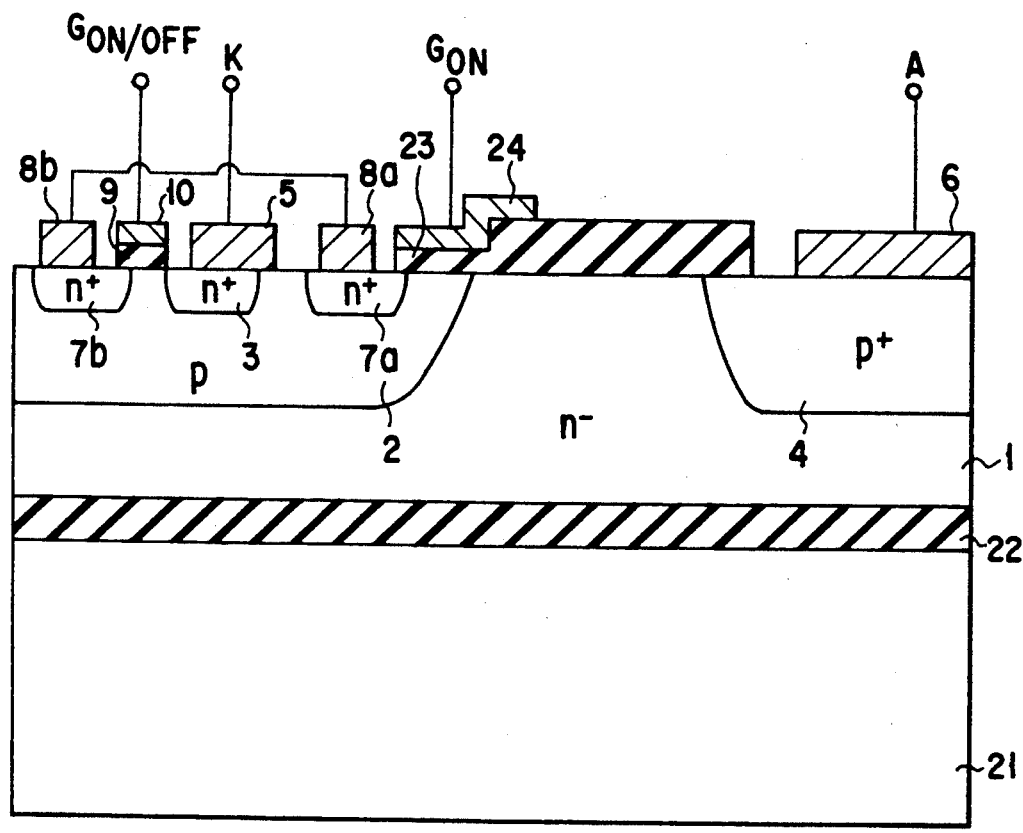
FIG. 23 is a cross sectional view taken along line XXIII—XXIII of FIG. 22.

FIG. 22 is the layout of the eleventh embodiment of the present invention in which the device of FIG. 21 is horizontally formed. FIG. 23 is a cross sectional view taken along line XXIII—XXIII of FIG. 22. The n-type base layer 1 is formed on the silicon substrate 21 with the oxide film 22 is interposed therebetween. This structure can be obtained by, for example, a technique in which two silicon substrates are directly adhered. The p-type base layer 2 and the p-type emitter layer 4, which are opposite to each other, are formed in the striped form, on the surface of the n-type base layer 1 with a predetermined distance. In the p-type base layer 2, the n-type emitter layer 3 having a striped pattern, the first n-type drain layer 7a, and the second n-type drain layer 7b are formed. The cathode electrode 5 is formed in a striped pattern so as to be in contact with the n-type emitter layer 3 as well as the p-type base layer. The turn-on and turn-off insulated gate 10 is formed in a striped pattern between the n-type emitter layer 3 and the second n-type drain layer 7b. The cross sectional structure of the turn-off MOSFET is the same as that of the embodiment of FIG. 1.

The gate electrode 24 is formed in a striped pattern on the region, which is sandwiched by the n-type first drain layer 7a in the p-type base layer 2 and the n-type base layer 1, via the gate insulating film 23. The gate electrode 24 is the turn-on gate electrode, which is omitted in the embodiment of FIG. 1. The drain electrodes 8a and 8b are integrally formed in a state that they are coupled to each other at the peripheral portion as shown in the drawing.

Though the drain electrode 8a is shown not to contact with the p-type base layer 2, it may contact the layer 2.

According to the horizontal type thyristor with an insulated gate of this embodiment, the positive voltage is applied to the gate electrodes 10 and 24 at the time of turn-on. Thereby, electrons are injected into the n-type base layer 1 from the n-type emitter layer 3 via the n-type channel formed under the gate electrode 10 and the n-type channel formed under the gate electrode 24, and the holes corresponding to the amount of the electrons are supplied to the n-type base layer 1 from the p-type emitter layer 4, and the device is turned on. At the time of turn-off, zero or negative voltage is applied to the gate electrodes 10 and 24. Thereby, similar to the previous embodiment, the hole current is bypassed and the device is turned off.

Also, in this embodiment, since the drain electrode 5 is partially separated from the n-type emitter layer 3, and comes in contact with the p-type base layer 2, the large current can be turned off similar to the previous embodiment.

Figure 24:
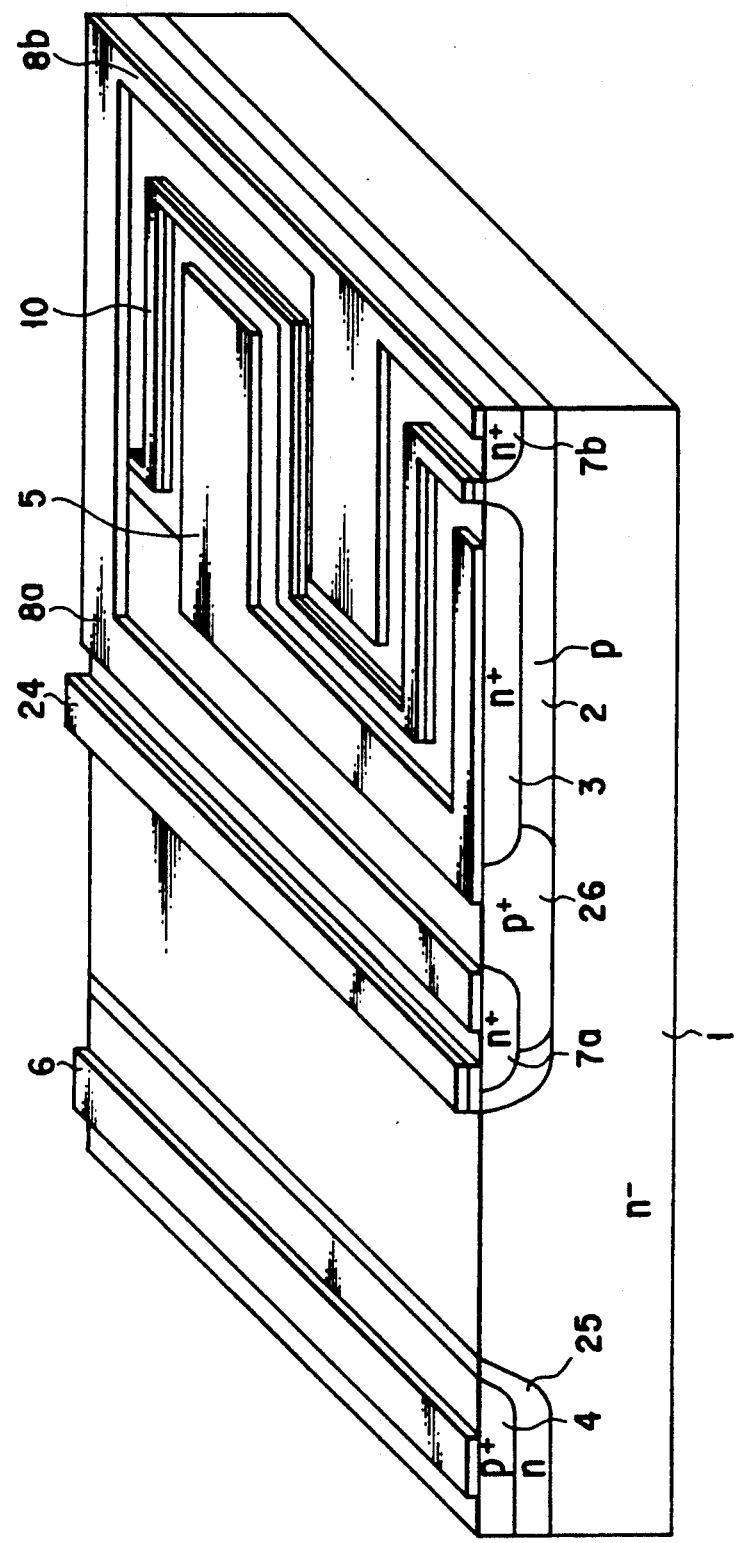
FIG. 24 is a perspective view showing a thyristor according to a twelfth embodiment of the present invention.

FIG. 24 is a perspective view of the horizontal type thyristor with an insulated gate of the twelfth embodiment of the present invention. According to this embodiment, the turn-off gate electrode 10 is formed in the zig-zag pattern, and the channel width of the turnoff MOSFET can be sufficiently long ensured. Also, the n-type buffer layer 25 is formed around the p-type emitter layer 4 so as to obtain a high breakdown voltage. The p-type layer 26 having a high impurity concentration is formed between the n-type emitter layer 3 and the n-type drain layer 7 so as to obtain a low resistance.

According to this embodiment, resistance of the channel of the turn-on and turn-off MOSFET is reduced, so that a low on-voltage can be obtained.

The following will explain the embodiments of the present invention which can be applied to the structure close to the turn-on gate electrode 24 shown in FIGS. 3, 7, 23, and so forth.

FIG. 26 is a cross sectional view showing a horizontal type high breakdown voltage MOSFET according to the thirteenth embodiment of the present invention. According to this embodiment, a p-channel layer 42 is formed in an n-type silicon substrate 41 having a low impurity concentration, that is, a high resistance, and an n-type source layer 43 having a high impurity concentration is formed therein. Also, an n-type drain layer 44 having a high impurity concentration is formed at the other position of the n-type substrate 41. These layers are formed in the same manner as the prior art. In the present invention, however, another n-type diffusion layer 46 having a high impurity concentration is formed to be opposite to the n-type source layer 43 such that a gate electrode 45 is sandwiched therebetween. As shown in the drawing, the n-type diffusion layer 46 is formed to extend over between the p-type channel layer 42 and the n-type substrate 41.

FIGS. 27A to 27D sequentially show the manufacturing process of the embodiment of FIG. 26.

Figure 27A:
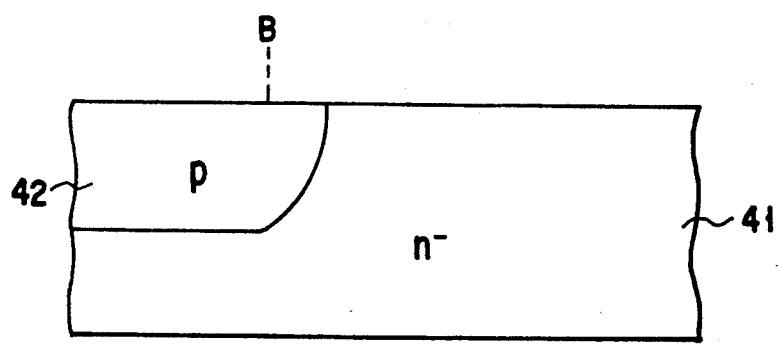
FIGS. 27A to 27D are cross sectional views sequentially showing the manufacturing process of the embodiment of FIG. 26.
Figure 27B:
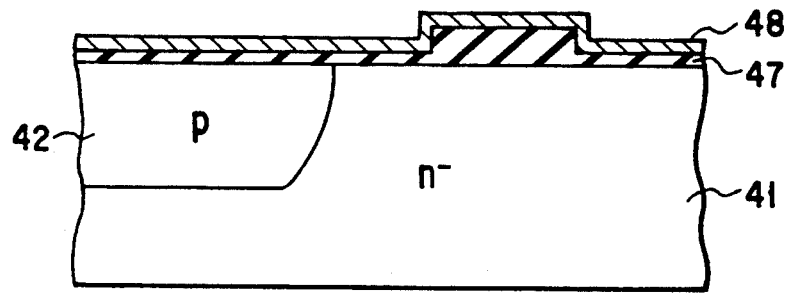
Figure 27C:
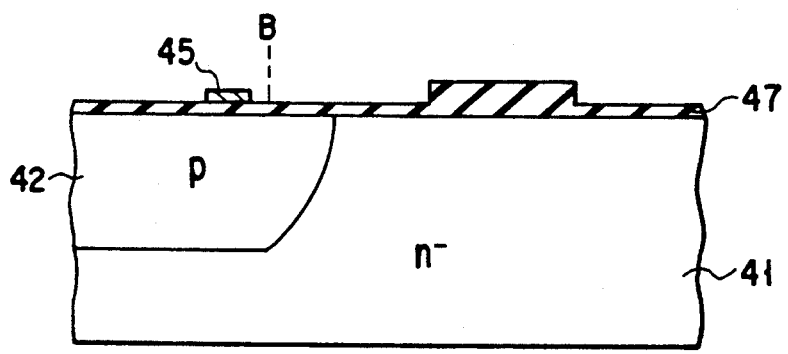
Figure 27D:
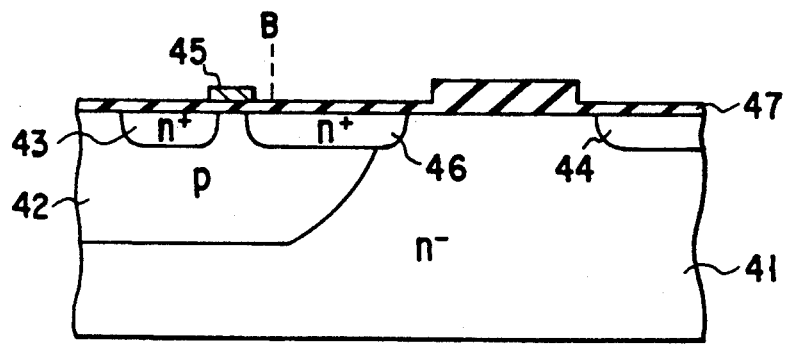

First, impurity material is diffused in the n-type substrate 41 from the left side of a position B (in the drawing) by means of a conventional selective diffusion method, thereby the p-type channel layer 42 is formed (FIG. 27A). Next, an oxide film 47 is formed on the entire surface and a polysilicon film 48 is formed thereon (FIG. 27B). The polysilicon film 48 is shaped into the gate electrode 45 (FIG. 27C). Then, the gate electrode 45 is used as a mask, and the n-type source layer 43 and the n-type diffusion layer 46 are formed on both sides of the gate electrode 45 by a self-alignment technique as in a common low breakdown voltage CMOS. At this time, the n-type drain layer 44 is also formed by diffusion (FIG. 27D). Then, the unnecessary portion of the oxide film 47 is removed, and the source electrode 51 and the drain electrode 52 are formed, thereby the structure shown in FIG. 26 is completed.

In the above manufacturing process, the n-type diffusion layer 46 is formed to extend over between the p-type channel layer 42 and the n-type substrate 41 as shown in the drawing. Thereby, the electron ejected from the n-type source layer 43 is injected into the n-type substrate 41 via the n-type diffusion layer 46.

In the horizontal high breakdown voltage MOSFET of FIG. 26, the horizontal diffusion region of the p-type channel layer 42 is not used as a channel. In other words, similar to the channel of a common low breakdown voltage MOSFET, the channel of the high breakdown voltage MOSFET uses the vertical diffusion region of the diffusion layer. Due to this, since the amount of implant dose of the high breakdown voltage MOSFET and that of the low breakdown voltage MOSFET can be the same, both channel layers can be formed by the one process. Moreover, by the fine processing technique, which can be used in a low breakdown CMOS manufacturing process, the channel length can be shortened and the on-resistance of the high breakdown voltage MOSFET can be reduced.

FIG. 28 shows a horizontal type high breakdown voltage MOSFET according to a fourteenth embodiment of the present invention. In this drawing, the same reference numerals as the embodiment of FIG. 26 are added to the portions corresponding to those of the embodiment of FIG. 26, and the detail explanation will be omitted.

This embodiment shows the case in which MOSFET shown in the embodiment of FIG. 26 is formed on the dielectric isolation substrate. That is, the substrate or wafer comprises a support layer 55 and the n-type active layer 41 insulated from each other by an oxide film 60. This type of the substrate can be obtained by a wafer direct-bonding method or an SIMOX method.

In the active layer 41, an oxide film 61 and a polysilicon buried layer 62 are formed so as to dielectrically isolate the high breakdown voltage MOSFET from another high breakdown voltage device or a low breakdown voltage device. Regarding the horizontal dielectric isolation structure, it is possible to use an isolation structure in which a trench or a V groove is formed.

Figure 37:
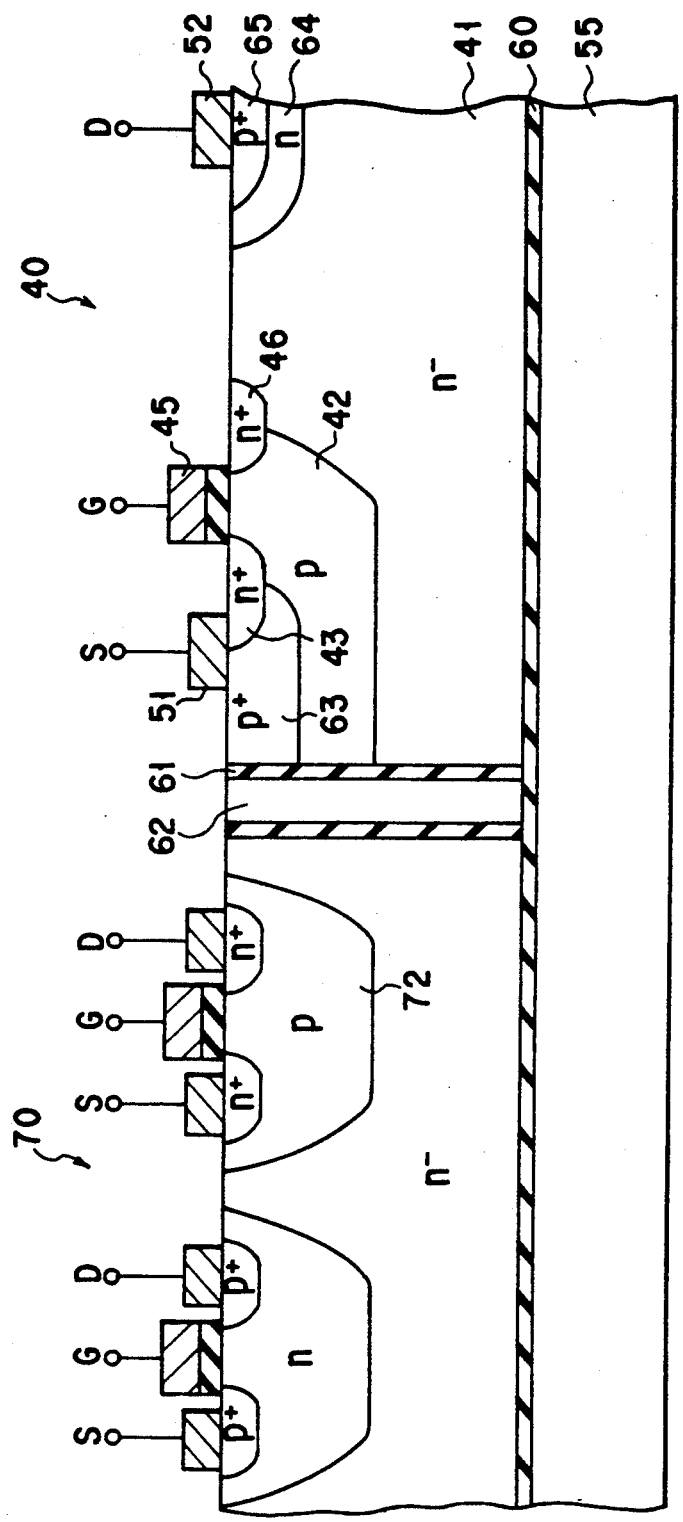
FIG. 37 is a cross sectional view of a twenty-second embodiment of the present invention, and shows a state that the high breakdown voltage IGBT of FIG. 30 and a low breakdown voltage CMOS are integrated on the same substrate.
Figure 38:
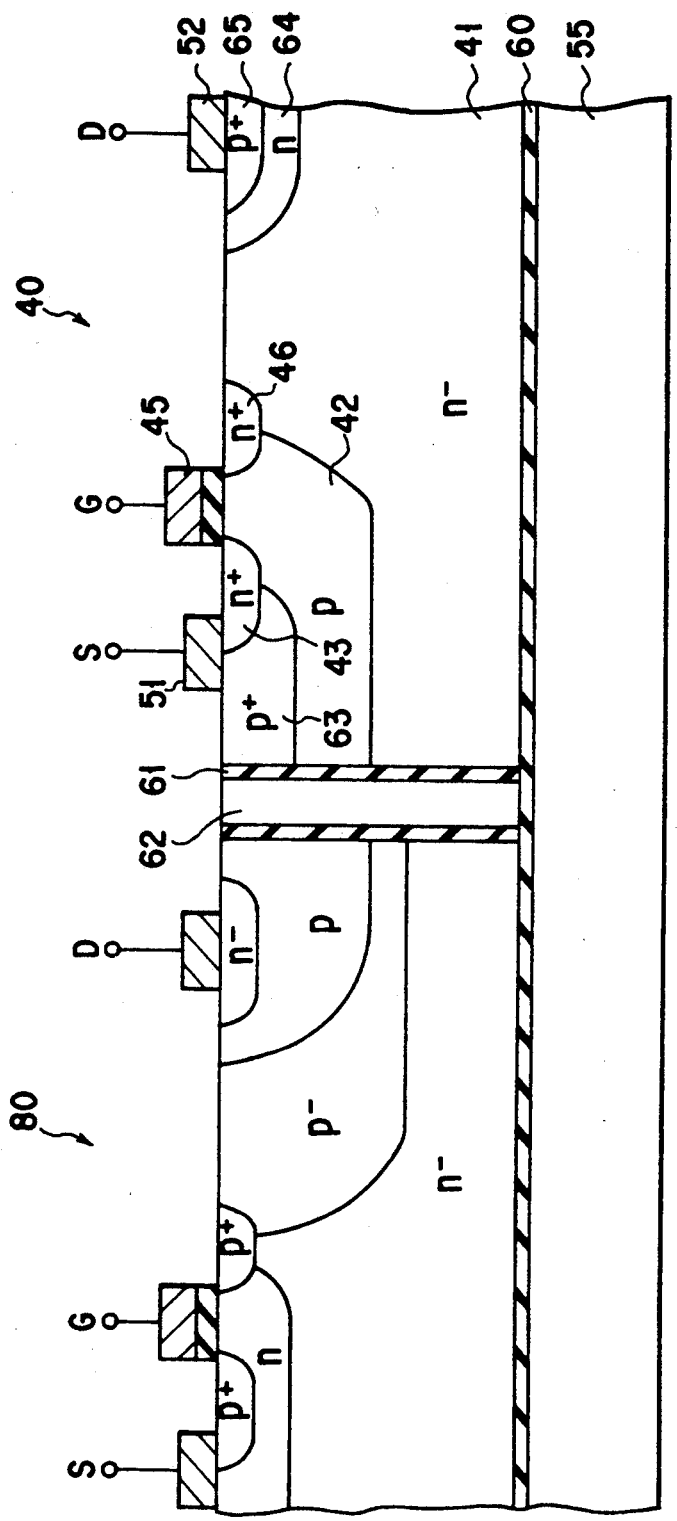
FIG. 38 is a cross sectional view of a twenty-third embodiment of the present invention, and shows a state that n-type and p-type high breakdown voltage IGBTs are integrated on the same substrate.

FIG. 28 shows only the high breakdown voltage MOSFET, which is the main part of the present invention. The relationship between the high breakdown voltage MOSFET and the other high breakdown voltage device or the low breakdown voltage device is established as shown in the mode of FIGS. 37 or 38.

Figure 29:
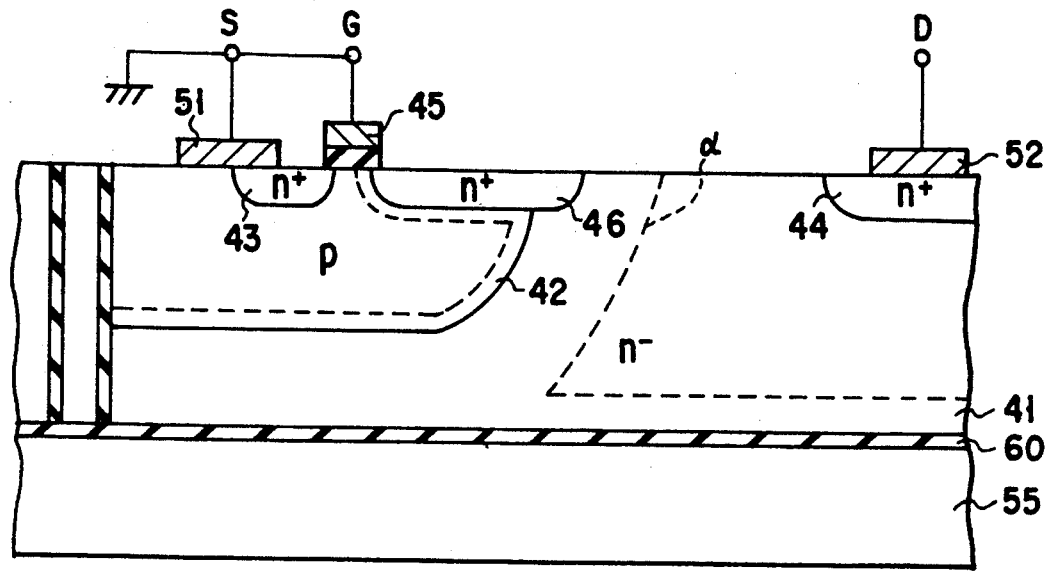
FIG. 29 is a cross sectional view showing the expansion of a depletion layer of the embodiment of FIG. 28.

FIG. 29 shows the expansion of a depletion layer d in the embodiment of FIG. 28, when the MOSFET gate and the source electrode are short-circuited and 10V is applied between the drain and the source. Since the additional n-type diffusion layer 46 is surrounded by the depletion layer d, no dielectric breakdown is generated under the high breakage voltage.

FIGS. 30 to 36 show fifteenth to twenty-first embodiments of the present invention in the same mode as FIG. 28. In the drawings, the same reference numerals as FIG. 28 and the previous drawings are added to the portions corresponding to those of FIG. 28 and the previous drawings, and the detail explanation will be omitted.

Figure 30:
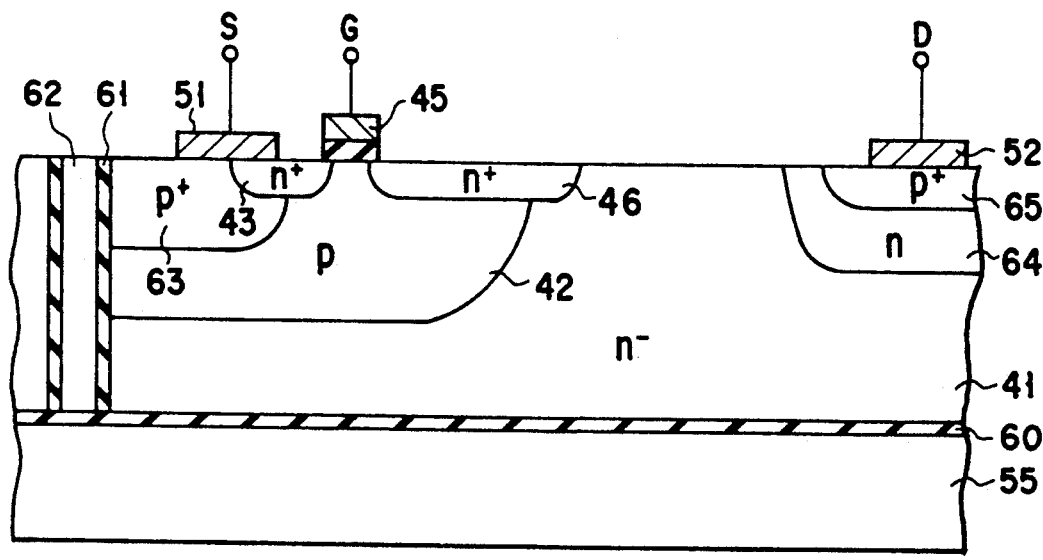
FIG. 30 is a cross sectional view showing a horizontal type high breakdown voltage IGBT according to a fifteenth embodiment of the present invention.

The fifteenth embodiment of FIG. 30 shows the horizontal type high breakdown voltage IGBT (or thyristor). The n-type drain layer 44 of the MOSFET of FIG. 28 is changed to a p-type drain layer 65 having a high impurity concentration, and holes are injected from the drain layer and the on-voltage is reduced. An n-type buffer layer 64 for controlling the expansion of the depletion layer and a p-type layer 63 having a high impurity concentration for controlling the latch-up of the n-type source layer 43 are formed, but these layers can be omitted.

The sixteenth embodiment of FIG. 31 also shows the horizontal type high breakdown voltage IGBT (or thyristor). In this embodiment, the substrate comprises the support layer 55 insulated by the oxide film 60 from a p-type active layer 66. The n-type base layer 41 is formed in the p-type active layer 66.

The seventeenth embodiment of FIG. 32 also shows the horizontal type high breakdown voltage IGBT (or thyristor). In this embodiment, the p-type channel layer 42 and the n-type buffer layer 64 are formed so as to extend to the oxide film 60.

The eighteenth embodiment of FIG. 33 also shows the horizontal type high breakdown voltage IGBT (or thyristor). In this embodiment, an n-type RESURF (reduced surface field) layer 67 having a low impurity concentration is added so as to improve optimum in breakdown voltage design.

The nineteenth embodiment of FIG. 34 also shows the horizontal type high breakdown voltage IGBT (or thyristor). In this embodiment, the RESURF layer 67 is added so as to improve optimum in breakdown voltage design. This embodiment is, however, a little different from the embodiment of FIG. 33 in the mode.

Figure 35:
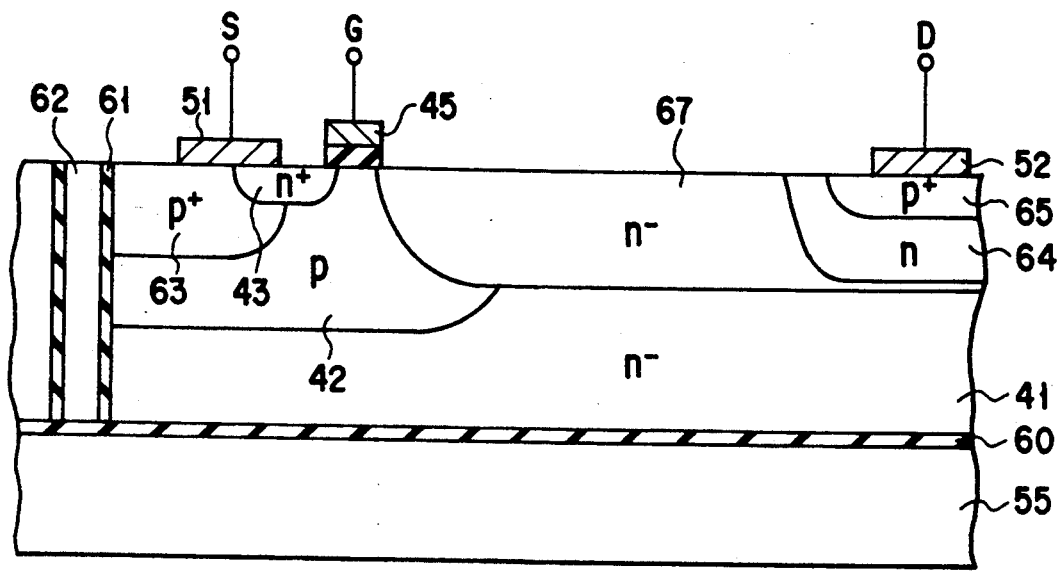
FIG. 35 is a cross sectional view showing a horizontal type high breakdown voltage IGBT according to a twentieth embodiment of the present invention.

The twentieth embodiment of FIG. 35 also shows the horizontal type high breakdown voltage IGBT (or thyristor). In this embodiment, the n-type diffusion layer and the n-type RESURF layer 67 are unified.

Figure 36:
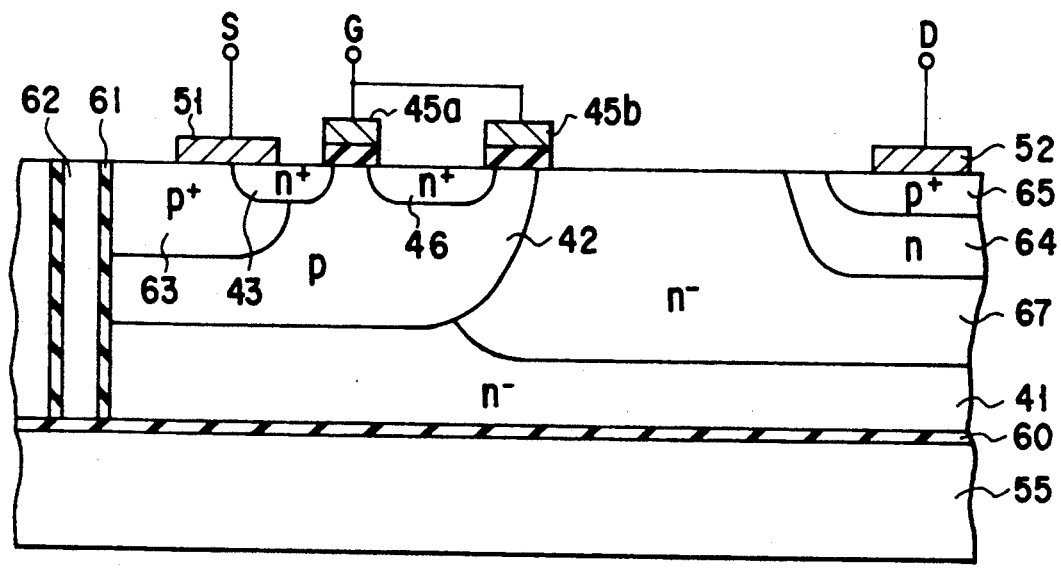
FIG. 36 is a cross sectional view showing a horizontal type high breakdown voltage IGBT according to a twenty-first embodiment of the present invention.

The twenty-first embodiment of FIG. 36 also shows the horizontal type high breakdown voltage IGBT (or thyristor). In this embodiment, the n-type diffusion layer 46 is formed so as to be contained in the p-type channel layer 42. The second gate electrode 45b is formed between the n-type diffusion layer 46 and the n-type RESURF layer 67, while the first gate electrode 45a is formed between the n-type source layer 43 and the n-type diffusion layer 46.

FIGS. 37 and 38 show the relationship between the high breakdown voltage device and another high breakdown voltage device or a low breakdown voltage device. In these drawings, the same reference numerals as the previous embodiments are added to the portions corresponding to those of the previous embodiments, and the detail explanation will be omitted.

In the twenty-second embodiment of FIG. 37, the horizontal high breakdown voltage IGBT 40 shown in FIG. 30 is formed on the right side (in the drawing) of the isolation structure 61 and 62. On the left side, a low breakdown voltage CMOS 70 is formed. In this case, the p-type channel layer 42 of the IGBT 40 and the p-type channel layer 72 of the CMOS 70 can be formed by a single process.

In the twenty-third embodiment of FIG. 38, the horizontal type high breakdown voltage IGBT 40 of the n-channel type the shown in FIG. 30 and a horizontal type high breakdown voltage IGBT 80 of the p-channel type are integrated on the same substrate.

Similar to the n channel type devices shown in FIGS. 26 to 36, a high breakdown voltage device of the p-channel type can be also integrated on the same substrate on which a low breakdown voltage device is integrated. It is obvious that the structure in which the polarity of each portion is reversed can be formed as the p channel type structure.

According to the structures of the high breakdown voltage devices shown in FIGS. 26 to 38, the diffusion layer having the same polarity as that of the source diffusion layer is added to the channel diffusion layer, thereby the channel to be formed in the channel diffusion layer can be formed in a vertical diffusion region, as in the case of a low breakdown voltage device. Therefore, the channel diffusion layers of the high breakdown voltage device and low breakdown voltage device can be formed with high accuracy by a single process. Due to this, it is unnecessary to use DSA structure as used in the conventional horizontal type high breakdown voltage device.

FIGS. 41 and 42 show EST which can improve voltage drop of IGBT and the amount of latch-up breakdown of a parasitic thyristor. In the drawings, the same reference numerals as FIG. 36 are added to the portions corresponding to the portions of FIG. 36.

The twenty-fourth embodiment of the present invention is characterized in that an n (n+) type diffusion layer 46 having a high impurity concentration contacts an oxide film 60. According to the structure of FIG. 41, holes coming out of a p-type drain layer 65, is interrupted by the n-type layer 46. Due to this, the holes little reach to a portion under an n-type source layer 43 having a high impurity concentration. In the conventional ESTs, the latch-up of the parasitic thyristor is caused by the voltage drop generated by a hole current flowing in the n-type source layer 43. Therefore, if there is no hole current flowing in the n-type source layer 43, the latch-up of the parasitic thyristor is not substantially generated.

In contrast, according to the EST of the twenty-fourth embodiment of the present invention, the n-type diffusion layer 46, which serves as an emitter of an npnp four-layered thyristor structure, is deeper than the diffusion layer of the conventional structure. Due to this, emitter injection efficiency increases, and the voltage drop of the device can be reduced.

In the manufacture of the EST of this embodiment, there is prepared a dielectric isolation substrate, that is, a wafer or substrate having a support layer 55 insulated by the oxide film 60 from an n-type active layer 41. This type of the substrate can be obtained by a wafer direct bonding method or an SIMOX method.

More specifically, the wafer to be served as the n (n−) type active layer 41 having a high resistance is oxidized, so that a oxide film 60 having a thickness of 10 μm is formed, and the wafer to be served as the support layer 55 is directly connected thereto. Moreover, the active layer 41 is further thinned to about 2 μm. Then, a trench is formed in the active layer 41 to reach to the oxide film 60. Sequentially, an oxide film 61 is formed by the surface oxidation, and a polysilicon layer 62 is buried, thereby the horizontal dielectric isolation structure is formed.

Next, electrode electrodes 45a and 45b are formed by a gate oxidation film and a polysilicon gate. Sequentially, an n-type buffer layer 64, and a p-type layer 42 are formed. Further, the deep n-type layer 46 is formed in the p-type layer 42 by diffusion. Then, the p (p+) layer 63 and drain layer 65 both having a high impurity concentration, and further, the n-type source layer 43 having a high impurity concentration are formed by diffusion. Finally, source and the drain electrodes 51 and 52 are formed, and the structure as shown in the drawing is completed.

According to the twenty-fifth embodiment of FIG. 42, an electrode 75 is formed on the n (n+) type diffusion layer 46 having a high impurity concentration in addition to the structure of FIG. 41. The electrode 75 performs the function in which recombination of electrons and holes at the surface of the n-type layer 46 is increased. In other words, the hole current flowing under the n-type source layer 43 can be reduced more than the the structure of FIG. 41.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A thyristor having an insulated gate, said thyristor comprising:

a base layer of a first conductivity type having a high resistance;

a base layer of a second conductivity type formed on a surface of said base layer of said first conductivity type;

an emitter layer of said second conductivity type connected to said base layer of said second conductivity type via said base layer of said first conductivity type;

an emitter layer of said first conductivity type formed within said base layer of said second conductivity type;

a drain electrode formed on said base layer of said second conductivity type at a position adjacent to said emitter layer of said first conductivity type;

a drain layer of said first conductivity type which is formed within said base layer of said second conductivity type and which forms a short circuit with said base layer of said second conductivity type via said drain electrode;

a source layer of said first conductivity type formed within said base layer of said second conductivity type and positioned a predetermined distance from said drain layer of said first conductivity type;

a turn-off insulated gate electrode formed on a gate insulating film which is in turn formed on said base layer of said second conductivity type between said drain layer of said first conductivity type and said source layer of said first conductivity type;

a first main electrode formed on said emitter layer of said second conductivity type;

a second main electrode formed on said emitter layer of said first conductivity type; and a source electrode formed on said source layer of said first conductivity type and connected to said second main electrode.

2. The thyristor according to claim 1, wherein said base layer of said second conductivity type is selectively formed within a surface of said base layer of said first conductivity type, and a turn-on insulated gate electrode is formed on a gate insulating film which is in turn formed on a region of said base layer of said second conductivity type at an end portion thereof, and is sandwiched between said emitter layer of said first conductivity type and said base layer of said first conductivity type.

3. The thyristor according to claim 2, wherein said drain electrode is arranged in its entirety between said turn-off insulated gate electrode and said turn-on insulated gate electrode.

4. The thyristor according to claim 2, wherein said emitter layer of said first conductivity type consists of a plurality of separately defined regions of said first conductivity type formed within said base layer of said second conductivity type, wherein said drain electrode comprises a main portion positioned with respect to said turn-on insulated gate electrode such that said turn-off insulated gate electrode is sandwiched therebetween, and wherein a branch portion of said turn-off insulated gate electrode is formed between said separately defined regions of said emitter layer of said first conductivity type and extends to said turn-on insulated gate electrode.

5. The thyristor according to claim 2, wherein said source layer of said first conductivity type and said emitter layer of said first conductivity type are unified as a single element, and wherein said source electrode and said second main electrode are unified as a single element.

6. The thyristor according to claim 5, wherein said emitter layer of said first conductivity type consists of a plurality of separately defined regions of said first conductivity type formed within said base layer of said second conductivity type, wherein said drain electrode comprises a main portion positioned with respect to said turn-on insulated gate electrode such that said turn-off insulated gate electrode is sandwiched therebetween, and wherein a branch portion of said turn-off insulated gate electrode is formed between said separately defined regions of said emitter layer of said first conductivity type and extends to said turn-on insulated gate electrode.

7. The thyristor according to claim 6, wherein said drain layer of said first conductivity type consists of a plurality of separately defined regions of said first conductivity type formed in said base layer of said second conductivity type.

8. A thyristor according to claim 5, wherein a main portion of said drain electrode is positioned with respect to said turn-on insulated gate electrode such that said turn-off insulated gate electrode is sandwiched therebetween, wherein said emitter layer of said first conductivity type is formed so as to have a concave cross-sectional shape, and wherein said drain layer of said first conductivity type consists of a plurality of separately defined regions of said first conductivity type formed within said base layer of said second conductivity type at portions adjacent to said emitter layer of said first conductivity type.

9. The thyristor according to claim 5, wherein said drain electrode is positioned with respect to said turn-on insulated gate electrode such that said turn-off insulated gate electrode is sandwiched therebetween, wherein said drain layer of said first conductivity type is formed so as to have a concave cross-sectional shape, and wherein said drain electrode comes in contact with said base layer of said second conductivity type at portions thereof where said drain layer of said first conductivity type is formed therein.

10. A thyristor having an insulated gate, said thyristor comprising:
a base layer of a first conductivity type having a high resistance;
a base layer of a second conductivity type formed on a surface of said base layer of said first conductivity type;
an emitter layer of said second conductivity type connected to said base layer of said second conductivity type via said base layer of said first conductivity type;
an emitter layer of said first conductivity type consisting of a plurality of separately defined regions of said first conductivity type formed within said base layer of said second conductivity type;
a drain electrode formed on said base layer of said second conductivity type at a position adjacent to said emitter layer of said first conductivity type;
a drain layer of said first conductivity type formed within said base layer of said second conductivity type at a position adjacent to said emitter layer of said first conductivity type, said drain layer of said first conductivity type forming a short circuit with said base layer of said second conductivity type via said drain electrode;
a turn-off insulated gate electrode formed on a gate insulating film which is in turn formed on said base layer of said second conductivity type between said drain layer of said first conductivity type and said emitter layer of said first conductivity type;
a first main electrode formed on said emitter layer of said second conductivity type; and
a second main electrode formed on said emitter layer of said first conductivity type.

11. The thyristor according to claim 10, wherein said base layer of said second conductivity type is selectively formed within a surface of said base layer of said first conductivity type, and wherein a turn-on insulated gate electrode is formed on a gate insulating film which is in turn formed on a region of said base layer of said second conductivity type at an end portion thereof and is sandwiched between said emitter layer of said first conductivity type and said base layer of said first conductivity type.

12. The thyristor according to claim 11, wherein said drain electrode comprises a main portion positioned with respect to said turn-on insulated gate electrode such that said turn-off insulated gate electrode is sandwiched therebetween, and wherein a branch portion of said turn-off insulated gate electrode is formed between said separately defined regions of said emitter layer of said first conductivity type and extends to said turn-on insulated gate electrode.

13. The thyristor according to claim 10, wherein said drain layer of said first conductivity type consists of a plurality of separately defined regions of said first conductivity type, and wherein said separately defined regions of said drain layer of said first conductivity type and said separately defined regions of said emitter layer of said first conductivity type are arranged in alternating order along a direction parallel to said turn-on insulated gate electrode.

14. A thyristor having an insulated gate, said thyristor comprising: a base layer of a first conductivity type having a high resistance;
a base layer of a second conductivity type formed on a surface of said base layer of said first conductivity type; an emitter layer of said second conductivity type connected to said base layer of said second conductivity type via said base layer of said first conductivity type; an emitter layer of said first conductivity type formed within said base layer of said second conductivity type;
a first drain layer of said first conductivity type formed within said base layer of said second conductivity type at a position adjacent to said emitter layer of said first conductivity type;
a second drain layer of said first conductivity type formed within said base layer of said second conductivity type at a position with respect to said first drain layer of said first conductivity type such that said emitter layer of said first conductivity type is formed therebetween; an insulated gate electrode formed on a gate insulating film which in turn is formed on said base layer of said second conductivity type between said emitter layer of said first conductivity type and said second drain layer of said first conductivity type;
a first main electrode formed on said emitter layer of said second conductivity type; a second main electrode formed on said emitter layer of said first conductivity type and on said base layer of said second conductivity type so as to form a short circuit therebetween;
and a short circuit electrode which connects said first drain layer and said second drain layer.

15. The thyristor according to claim 14, wherein said base layer of said second conductivity type is selectively formed within a surface of said base layer of said first conductivity type, and wherein a turn-on insulated gate electrode is formed on a gate insulating film which in turn is formed on a region of said base layer of said second conductivity type at an end portion thereof and is sandwiched between said first drain layer of said first conductivity type and said base layer of said first conductivity type.

16. The thyristor according to claim 1, wherein said source layer of said first conductivity type forms a short circuit with said base layer of said second conductivity type via said source electrode.

* * * * *